US011923459B2

(12) United States Patent
Li et al.

(10) Patent No.: US 11,923,459 B2
(45) Date of Patent: Mar. 5, 2024

(54) TRANSISTOR INCLUDING HYDROGEN DIFFUSION BARRIER FILM AND METHODS OF FORMING SAME

(71) Applicant: Taiwan Semiconductor Manufacturing Company Limited, Hsinchu (TW)

(72) Inventors: Hung Wei Li, Hsinchu (TW); Mauricio Manfrini, Zhubei (TW); Sai-Hooi Yeong, Zhubei (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 179 days.

(21) Appl. No.: 17/228,534

(22) Filed: Apr. 12, 2021

(65) Prior Publication Data
US 2021/0399139 A1    Dec. 23, 2021

Related U.S. Application Data

(60) Provisional application No. 63/042,583, filed on Jun. 23, 2020.

(51) Int. Cl.
*H01L 29/786* (2006.01)
*H01L 29/40* (2006.01)
(Continued)

(52) U.S. Cl.
CPC ...... *H01L 29/78618* (2013.01); *H01L 29/401* (2013.01); *H01L 29/41733* (2013.01);
(Continued)

(58) Field of Classification Search
CPC ........... H01L 27/1225; H01L 29/78606; H01L 27/0688; H01L 29/7869; H01L 27/105; H01L 29/66969
See application file for complete search history.

(56) References Cited

U.S. PATENT DOCUMENTS

2015/0279670 A1* 10/2015 Cho ................... H01L 29/7869
257/43

FOREIGN PATENT DOCUMENTS

KR          20200119119 A     10/2020

OTHER PUBLICATIONS

Korean Patent Office; Application No. 10-2021-0076101; Office Action dated Sep. 22, 2022, 6 pages.
(Continued)

*Primary Examiner* — Selim U Ahmed
(74) *Attorney, Agent, or Firm* — The Marbury Law Group, PLLC

(57) ABSTRACT

A thin film transistor and method of making the same, the thin film transistor including: a substrate; a word line disposed on the substrate; a semiconductor layer disposed on the substrate, the semiconductor layer having a source region, a drain region, and a channel region disposed between the source and drain regions and overlapping with the word line in a vertical direction perpendicular to a plane of the substrate; a hydrogen diffusion barrier layer overlapping with the channel region in the vertical direction; a gate dielectric layer disposed between the channel region and the word line; and source and drain electrodes respectively electrically coupled to the source and drain regions.

20 Claims, 25 Drawing Sheets

(51) Int. Cl.
    *H01L 29/417*     (2006.01)
    *H01L 29/423*     (2006.01)
    *H01L 29/66*     (2006.01)
    *H10B 51/30*     (2023.01)
    *H10B 51/40*     (2023.01)
    *H10B 61/00*     (2023.01)
    *H10B 63/00*     (2023.01)

(52) U.S. Cl.
    CPC .. *H01L 29/41775* (2013.01); *H01L 29/42384* (2013.01); *H01L 29/66742* (2013.01); *H01L 29/78642* (2013.01); *H01L 29/7869* (2013.01); *H01L 29/78696* (2013.01); *H10B 51/30* (2023.02); *H10B 51/40* (2023.02); *H10B 61/22* (2023.02); *H10B 63/34* (2023.02); *H10B 63/80* (2023.02)

(56) References Cited

OTHER PUBLICATIONS

Korean Patent and Trademark Office, Application No. 10-2021-0076101, Office Action dated Jun. 27, 2023, 3 pages.

\* cited by examiner

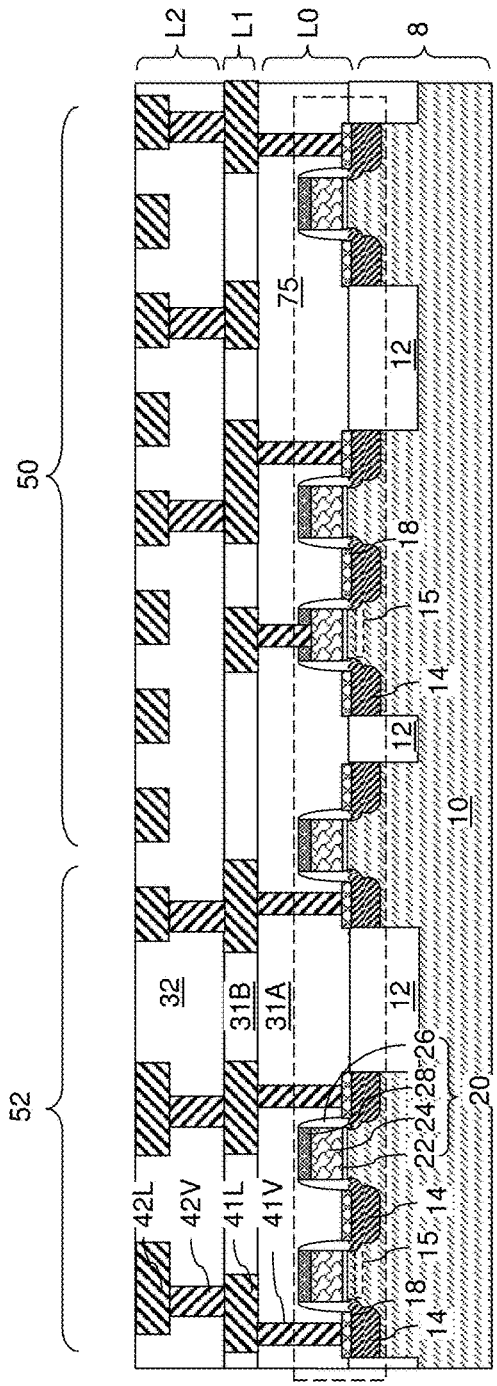
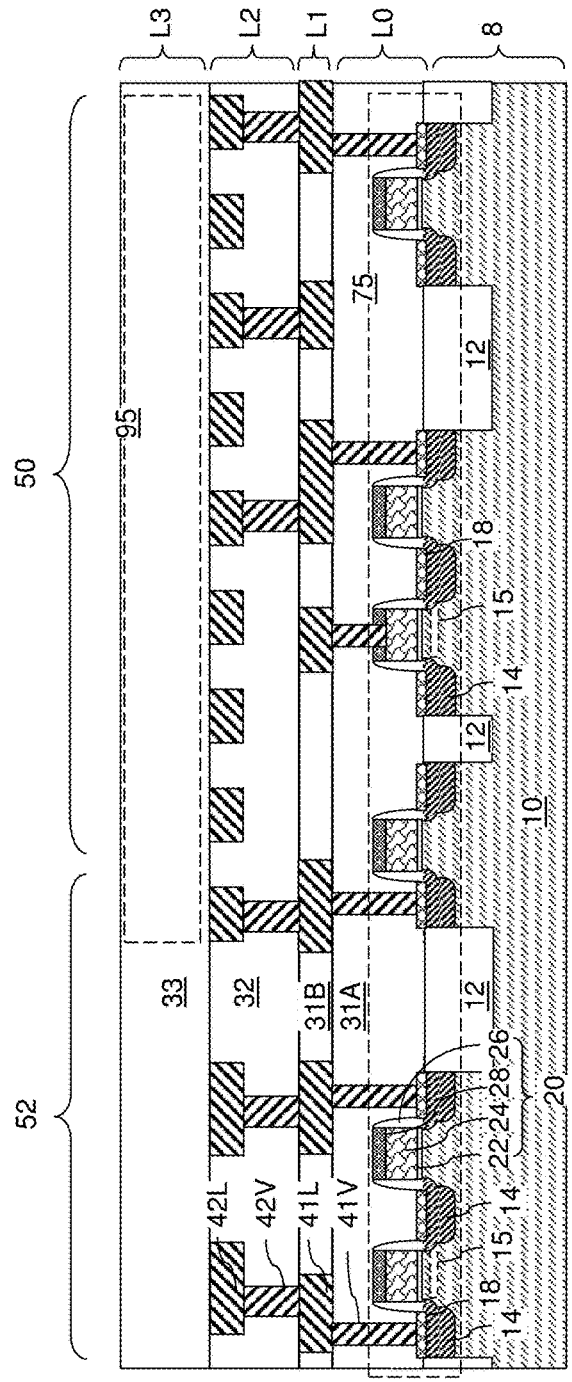
FIG. 1A
FIG. 1B

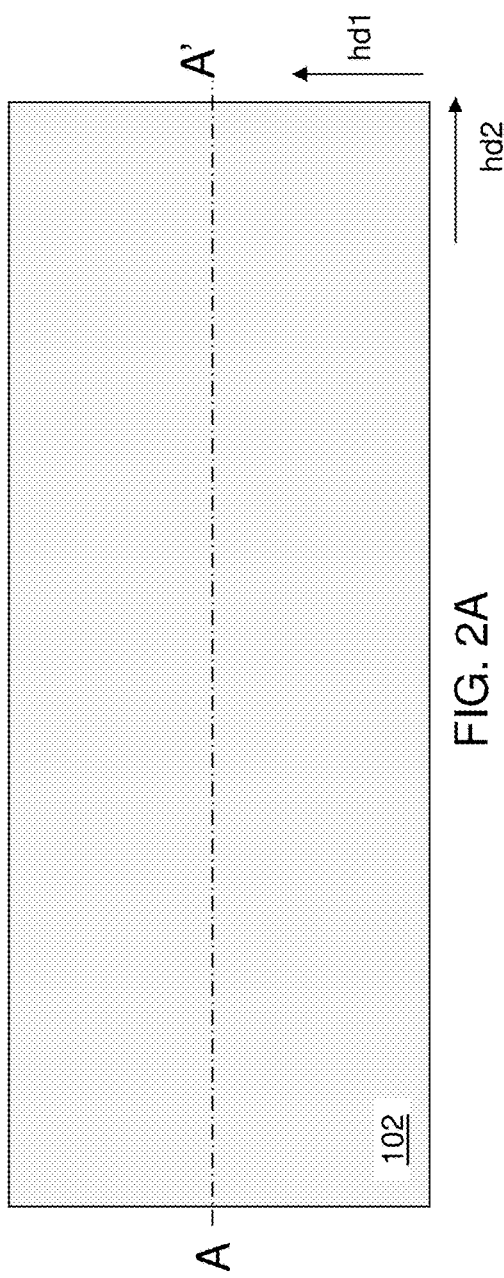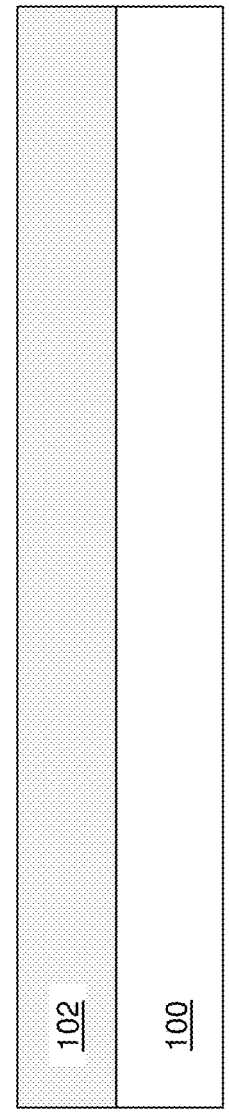

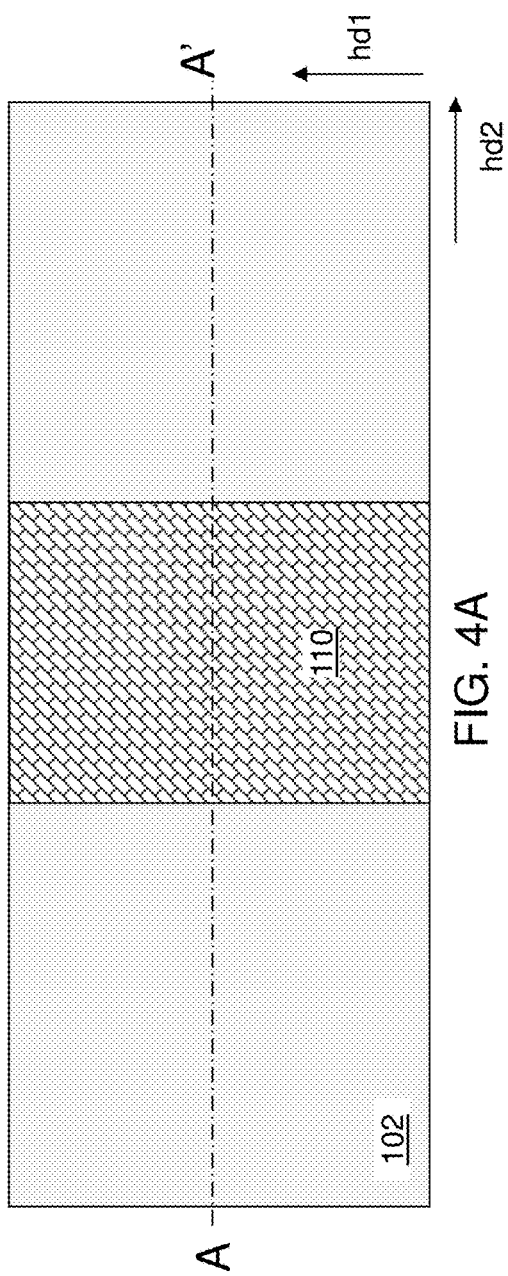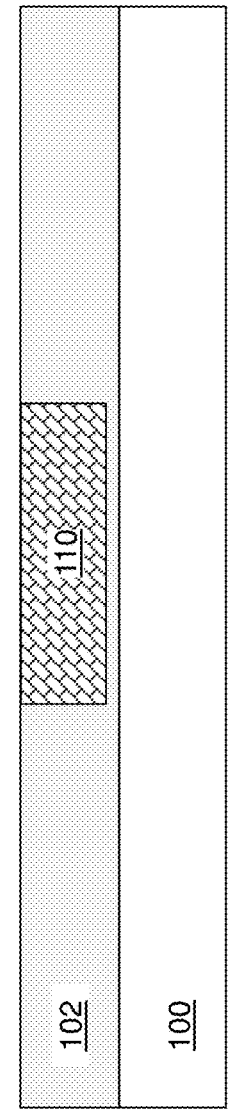

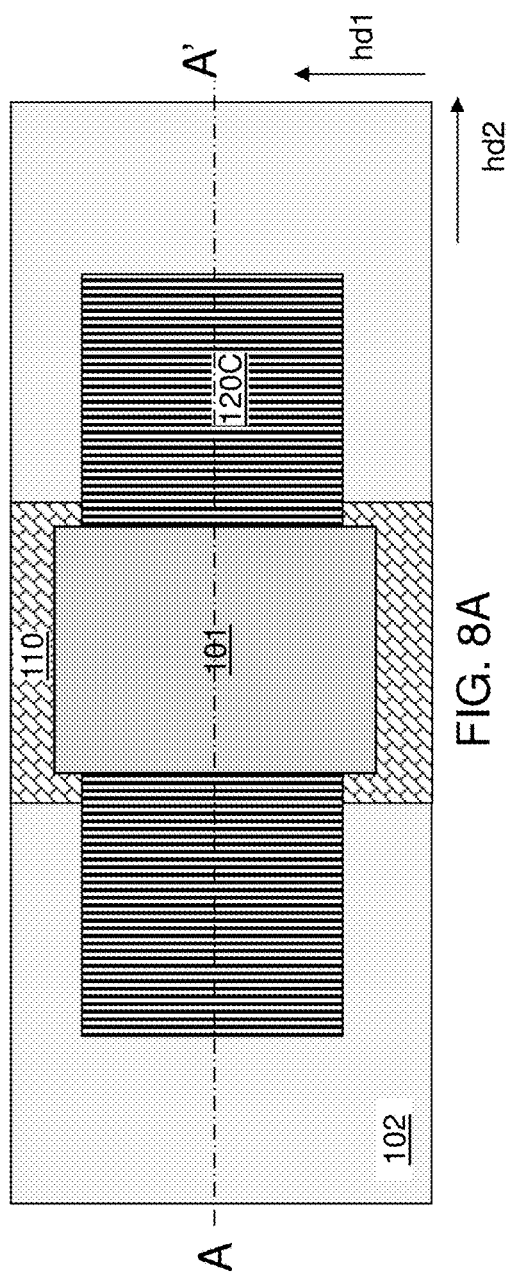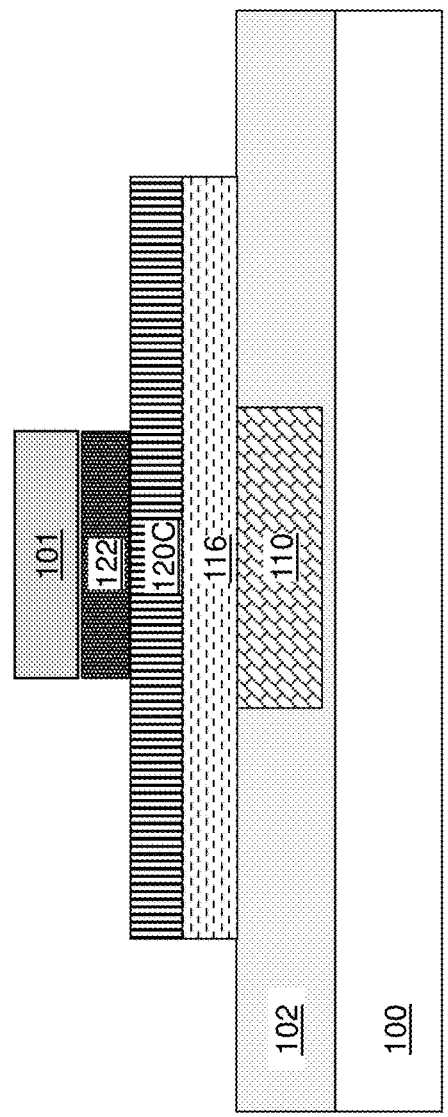

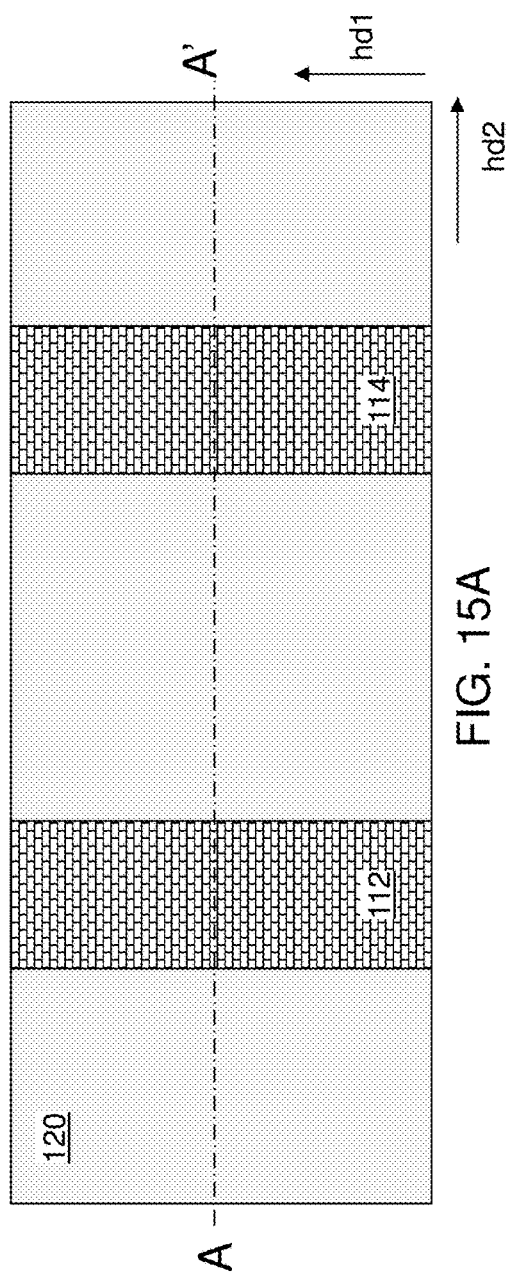
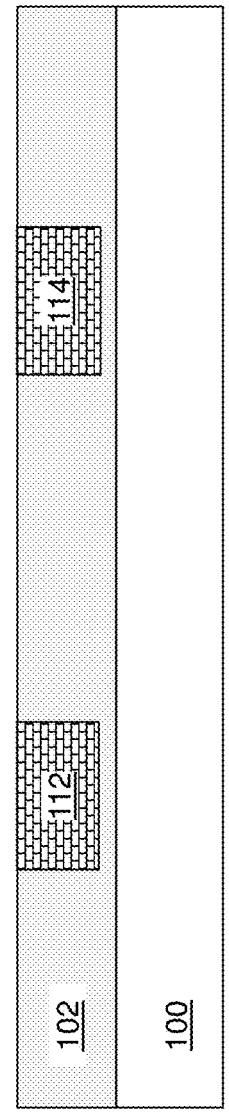
FIG. 15A
FIG. 15B

TRANSISTOR INCLUDING HYDROGEN DIFFUSION BARRIER FILM AND METHODS OF FORMING SAME

RELATED APPLICATIONS

This application claims priority to U.S. Provisional Patent Application No. 63/042,583, entitled "Formation of hard mask layer in GX FET", filed on Jun. 23, 2020, the entire contents of which are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices.

Nevertheless, such BEOL transistors may still be subject to gases in the ambient environment during the formation of other BEOL devices. For example, BEOL transistor may be exposed to plasma and air in the ambient environment. Ambient environment gases such as hydrogen may corrupt layers of the BEOL transistors and degrade the effectiveness of fabricated devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure prior to formation of an array of TFTs according to an embodiment of the present disclosure.

FIG. 1B is a vertical cross-sectional view of the first exemplary structure during formation of the BEOL transistors according to an embodiment of the present disclosure.

FIG. 2A is a plan view of an intermediate structure of a TFT after the deposition of a first dielectric layer over a substrate according to various embodiments of the present disclosure.

FIG. 2B is a vertical cross-sectional view taken along line A-A' of FIG. 2A according to various embodiments of the present disclosure.

FIG. 4A is a plan view of an intermediate structure of a TFT after the deposition of a metallic fill material in the word line trench to form a word line according to various embodiments of the present disclosure.

FIG. 4B is a vertical cross-sectional view taken along line A-A' of FIG. 4A according to various embodiments of the present disclosure.

FIG. 8A is a plan view of an intermediate structure of a TFT after the patterning of the hydrogen diffusion barrier film according to various embodiments of the present disclosure.

FIG. 8B is a vertical cross-sectional view taken along line A-A' of FIG. 8A according to various embodiments of the present disclosure.

FIG. 15A is a plan view of an intermediate structure of a TFT after the deposition of a metallic fill material in the source line trench and drain line trench to form a source line and drain line according to various alternative embodiments of the present disclosure.

FIG. 15B is a vertical cross-sectional view taken along line A-A' of FIG. 15A according to various alternative embodiments of the present disclosure.

DETAILED DESCRIPTION

Figure 1C:
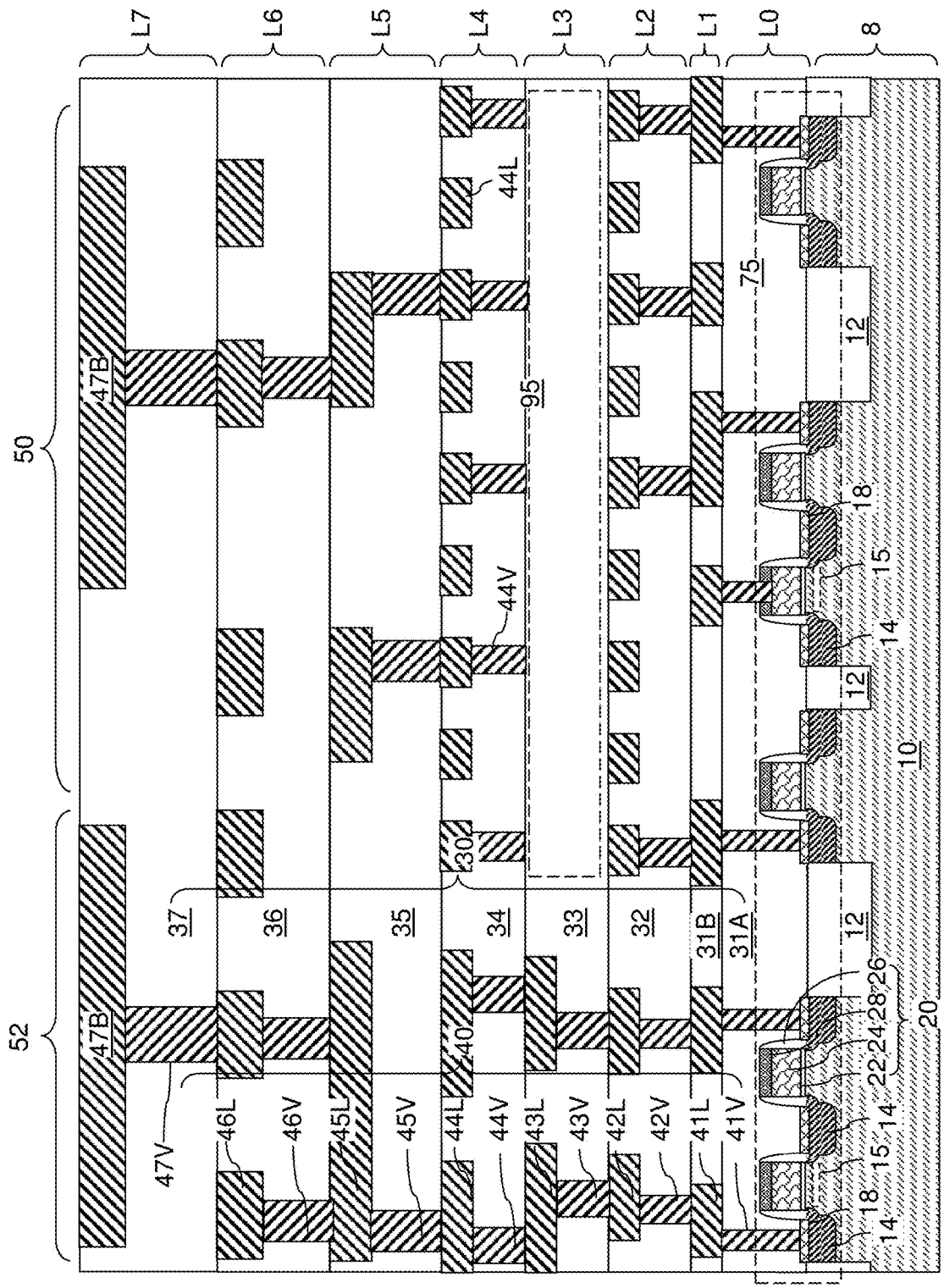
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range. As used herein, the terms "substantially" and "about" refer to a variation of +/−5%.

The present disclosure is directed to semiconductor devices, and specifically to TFT devices including hydrogen diffusion barrier films to protect a semiconducting channel layer from exposure to ambient gases that may degrade the TFT's performance, and methods of forming the same.

Memory devices include a grid of independently functioning memory cells formed on a substrate. Memory devices may include volatile memory cells or nonvolatile (NV) memory cells. Emerging memory technologies seek to store more data at less cost than the expensive-to-build silicon chips used by popular consumer electronics. Such emerging memory devices may be used to replace existing memory technologies such as flash memory in near future. While existing resistive random-access memories have generally been adequate for their intended purposes, as device scaling-down continues, they have not been entirely satisfactory in all respects.

In some memory devices, CMOS transistors may be used as the selecting transistor. However, size limitation of the CMOS transistor technology may be the limiting factor in improving the size and memory cell density of memory devices. The various embodiments described herein provide improved TFTs, which may be used as selecting transistors in various devices.

TFT may be fabricated in a BEOL position. By fabricating the TFTs in the BEOL position, functionality may be added at the BEOL while valuable chip area may be made available in the FEOL. Moreover, TFTs made of oxide semiconductors are an attractive option for BEOL integration since TFTs may be processed at low temperatures and thus, will not damage previously fabricated devices. While fabricating TFTs in the BEOL protects the TFTs from a number of harsh conditions, BEOL transistors may still be subject to gases in the ambient environment during the formation of other BEOL devices. For example, BEOL transistor may be exposed to plasma and air in the ambient environment. Ambient environment gases such as hydrogen may corrupt layers of the BEOL transistors and degrade the effectiveness of fabricated devices. Accordingly, the various embodiments disclosed herein seek to protect the TFTs by incorporating a hydrogen diffusion barrier film layer.

Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon dioxide layer). The exemplary structure may include various devices regions, which may include a memory array region 50 in which at least one array of non-volatile memory cells may be subsequently formed.

For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a FEOL operation. For example, shallow trench isolation structures 12 may be formed in an upper portion of the semiconductor material layer 10 by forming shallow trenches and subsequently filling the shallow trenches with a dielectric material such as silicon dioxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of TFTs to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon dioxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Referring to FIG. 1B, an array 95 of non-volatile memory cells and TFT selector devices may be formed in the memory array region 50 over the second interconnect-level structure L2. The details for the structure and the processing steps for the array 95 of non-volatile memory cells and TFT selector devices are subsequently described in detail below. A third interconnect level dielectric layer 33 may be formed during formation of the array 95 of non-volatile memory cells and TFT selector devices. The set of all structures formed at the level of the array 95 of non-volatile memory cells and TFT selector devices transistors is herein referred to as a third interconnect-level structure L3.

Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which may include third metal via structures 44V and fourth metal lines 44L. The fifth interconnect-level structure L5 may include a fifth interconnect level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric layer may be referred to as an interconnect level dielectric (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

Conventional TFTs include source and drain electrodes that contact a channel layer and overlap with a gate electrode that is separated from the channel by a gate insulating layer. However, during manufacturing, a channel region of the channel layer may be degraded by processing conditions, such as deposition process plasma, and/or contact with air. In addition, it may be difficult to precisely control the formation of an $N^+$ doped region.

FIG. 2A is a plan view of an intermediate structure of a TFT after the deposition of a first dielectric layer over a substrate according to various embodiments of the present disclosure. FIG. 2B is a vertical cross-sectional view taken along line A-A' of FIG. 2A according to various embodiments of the present disclosure. With reference to FIGS. 2A and 2B, a first dielectric layer 102 may be deposited on a substrate 100. The substrate 100 may be any suitable substrate, such as a plastic, glass, or semiconductor substrate, and may include control elements formed during FEOL processes. In some embodiments, the substrate 100 may be an interconnect level dielectric (ILD) layer such as interconnect level dielectric layer (ILD) layer 33. The first dielectric layer 102 may be formed of any suitable dielectric material, as described above. The first dielectric layer 102 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Figure 3A:
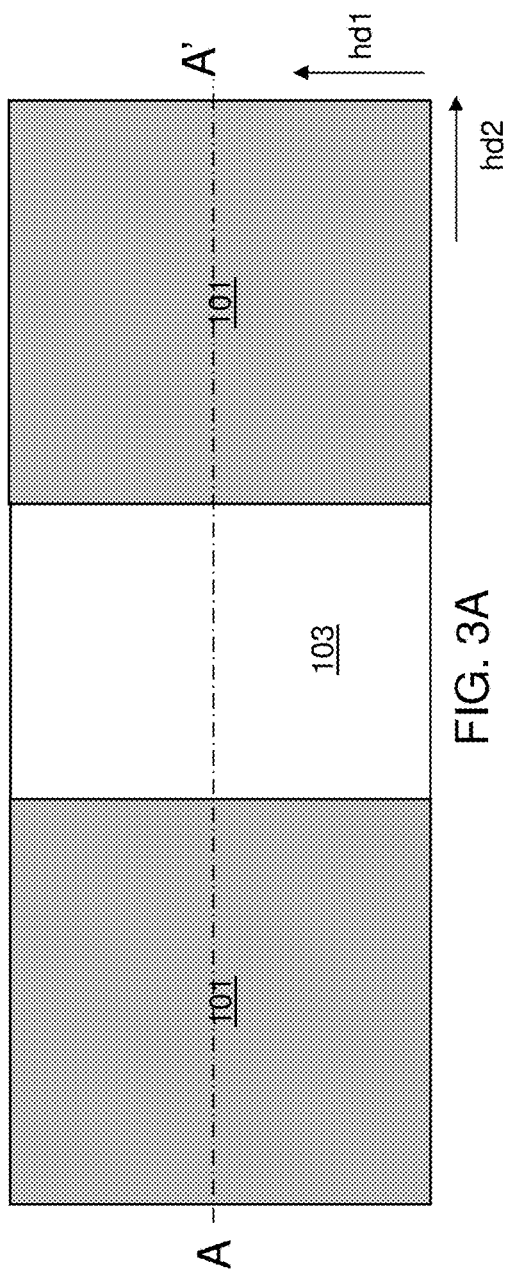
FIG. 3A is a plan view of an intermediate structure of a TFT after the formation of a word line trench in the first dielectric layer according to various embodiments of the present disclosure.
Figure 3B:
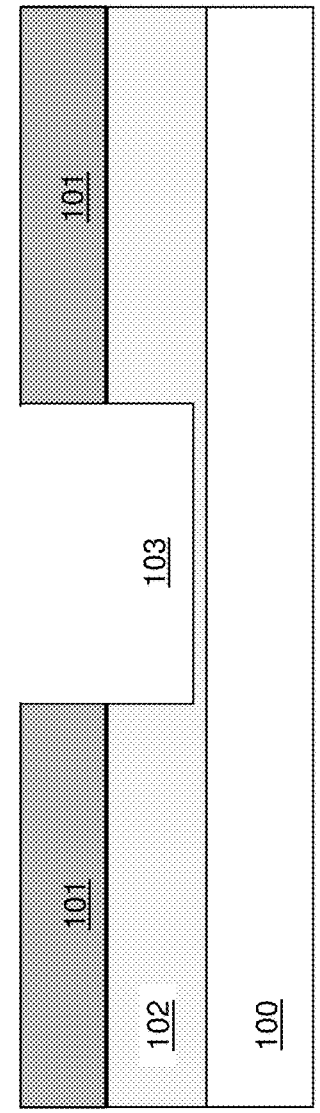
FIG. 3B is a vertical cross-sectional view taken along line A-A' of FIG. 3A according to various embodiments of the present disclosure.

FIG. 3A is a plan view of an intermediate structure of a TFT after the formation of a word line trench in the first dielectric layer according to various embodiments of the present disclosure. FIG. 3B is a vertical cross-sectional view taken along line A-A' of FIG. 3A according to various embodiments of the present disclosure. With reference to FIGS. 3A and 3B, a photoresist layer 101 may be applied over the first dielectric layer 102. The photoresist layer 101 may be lithographically patterned to form a line and space pattern that includes photoresist material strips that extend along the first horizontal direction hd1. An anisotropic etch process may be performed to etch unmasked portions of the first dielectric layer 102. A word line trench 103 extending along the first horizontal direction hd1 may be formed in areas that are not masked by the photoresist material strips. The anisotropic etch process may use any suitable etching process, such as a wet or dry etching process. The photoresist layer 101 may be subsequently removed, for example, by ashing.

FIG. 4A is a plan view of an intermediate structure of a TFT after the deposition of a metallic fill material in the word line trench to form a word line according to various embodiments of the present disclosure. FIG. 4B is a vertical cross-sectional view taken along line A-A' of FIG. 4A according to various embodiments of the present disclosure. With reference to FIGS. 4A and 4B, an electrically conductive metallic fill material may be deposited over the first dielectric layer 102 to full word line trench 103. A planarization process, such as CMP, may then be performed to planarize upper surfaces of the first dielectric layer 102 and the word lines 110, and remove any excess electrically conductive metallic fill material from the upper surface of the first dielectric layer 102 and word line trench 103. The word lines 110 may be formed of any suitable electrically conductive metallic fill material, using any suitable deposition method as described herein. For example, the word lines 110 may be formed of copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive metallic fill material are within the contemplated scope of disclosure.

Figure 5A:
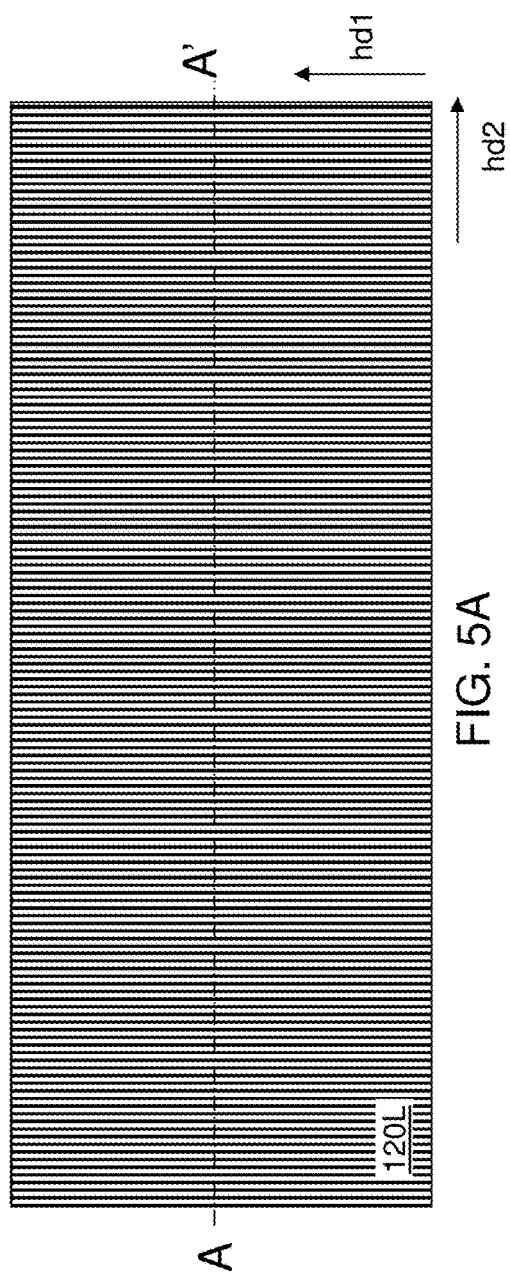
FIG. 5A is a plan view of an intermediate structure of a TFT after the deposition of a gate dielectric blanket layer and a semiconductor blanket layer material according to various embodiments of the present disclosure.
Figure 5B:
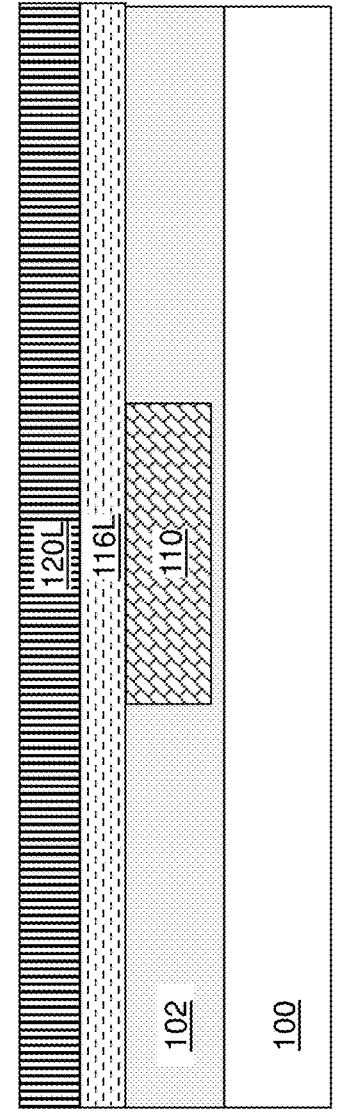
FIG. 5B is a vertical cross-sectional view taken along line A-A' of FIG. 5A according to various embodiments of the present disclosure.

FIG. 5A is a plan view of an intermediate structure of a TFT after the deposition of a gate dielectric blanket layer and a semiconductor blanket layer material according to various embodiments of the present disclosure. FIG. 5B is a vertical cross-sectional view taken along line A-A' of FIG. 5A according to various embodiments of the present disclosure. With reference to FIGS. 5A and 5B, a gate dielectric material blanket layer 116L and a semiconductor material blanket layer 120L may be deposited on the first dielectric layer 102, covering the word lines 110. In particular, the gate dielectric blanket layer 116L may be formed of any suitable dielectric material, using any suitable deposition process, as described herein. The semiconductor material blanket layer 120L may be deposited using any suitable deposition process, as described herein. The semiconductor material blanket layer 120L may comprise polysilicon, amorphous silicon, or a metal oxide semiconducting material, such as InGaZnO (IGZO), indium tin oxide (ITO), InWO, InZnO, InSnO, GaOx, $InO_x$, or the like. However, other suitable semiconductor materials are within the contemplated scope of the present disclosure.

Figure 6A:
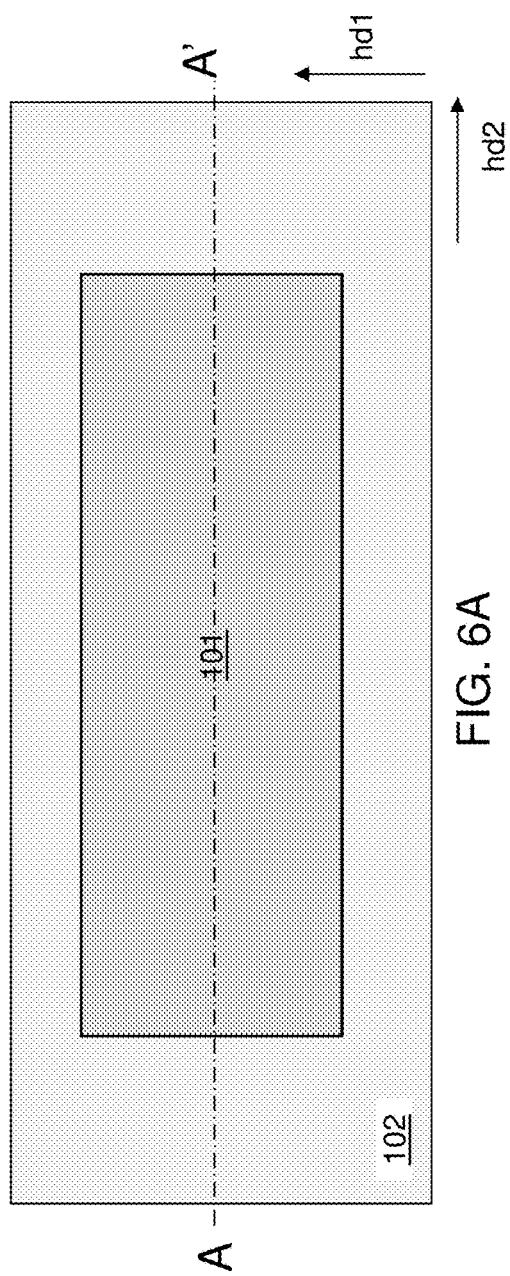
FIG. 6A is a plan view of an intermediate structure of a TFT after the patterning of gate dielectric blanket layer and a semiconductor blanket layer according to various embodiments of the present disclosure.
Figure 6B:
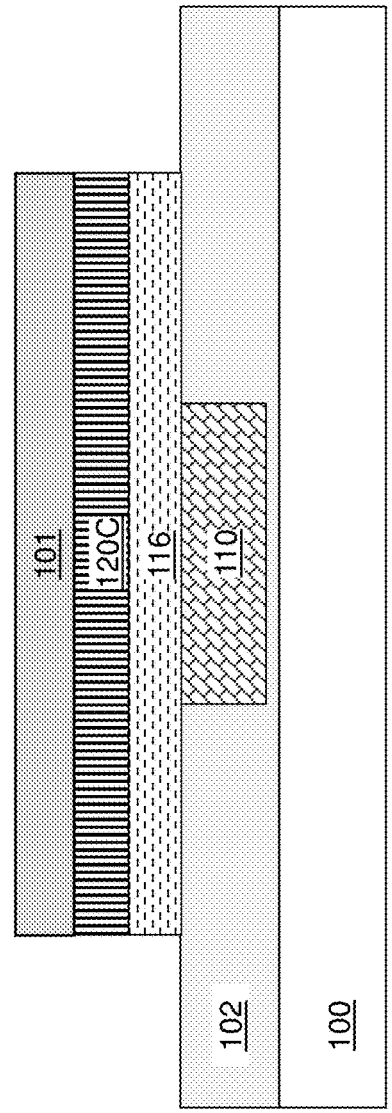
FIG. 6B is a vertical cross-sectional view taken along line A-A' of FIG. 6A according to various embodiments of the present disclosure.

FIG. 6A is a plan view of an intermediate structure of a TFT after the patterning of gate dielectric blanket layer and a semiconductor blanket layer according to various embodiments of the present disclosure. FIG. 6B is a vertical cross-sectional view taken along line A-A' of FIG. 6A according to various embodiments of the present disclosure. Referring to FIGS. 6A and 6B, the semiconductor material blanket layer 120L may be patterned to form a semiconductor layer 120. In particular, a photoresist layer 101 may be applied over the semiconductor material blanket layer 120L. The photoresist layer 101 may be lithographically patterned to form a line pattern that includes photoresist material strips that extend along the second horizontal direction hd2. An anisotropic etch process may be performed to etch unmasked portions of the semiconductor material blanket layer 120L. A semiconductor layer 120 and gate dielectric 116 may be formed, wherein both extend along the second horizontal direction hd2 in areas that are not masked by the photoresist material strips. The anisotropic etch process may use any suitable etching process, such as a wet or dry etching process. The photoresist layer 101 may be subsequently removed, for example, by ashing.

As shown in FIGS. 6A and 6B, the gate dielectric layer 116 may also be etched. However, in other embodiments, the semiconductor material blanket layer 120L may be etched selective to the gate dielectric layer (e.g., the gate dielectric layer 116L may remain substantially un-etched).

Figure 7A:
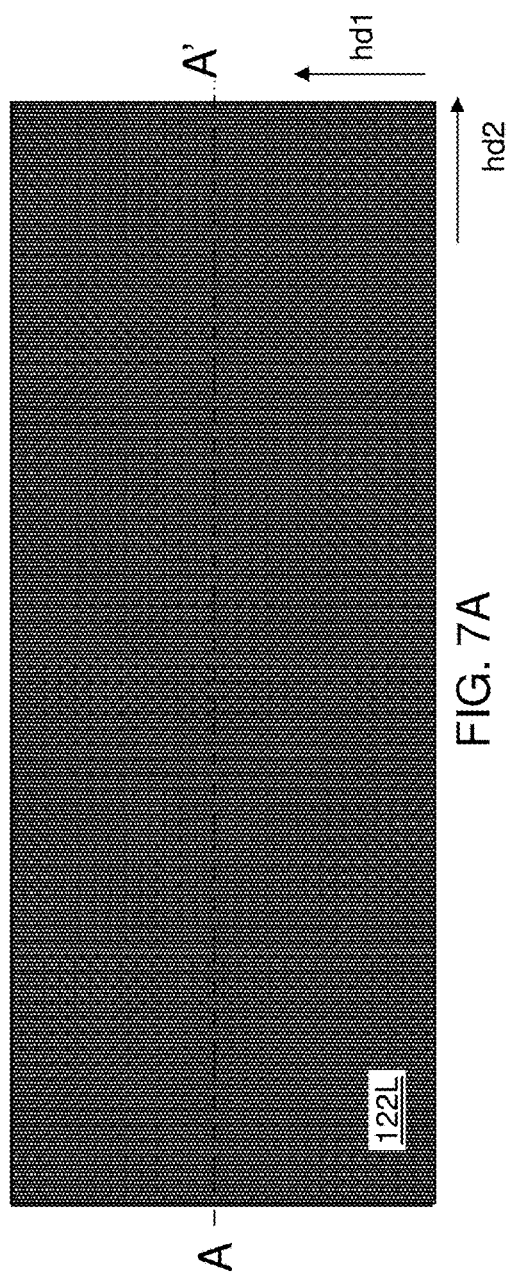
FIG. 7A is a plan view of an intermediate structure of a TFT after the deposition of a hydrogen diffusion barrier film layer over the patterned gate dielectric layer and semiconductor layer according to various embodiments of the present disclosure.
Figure 7B:
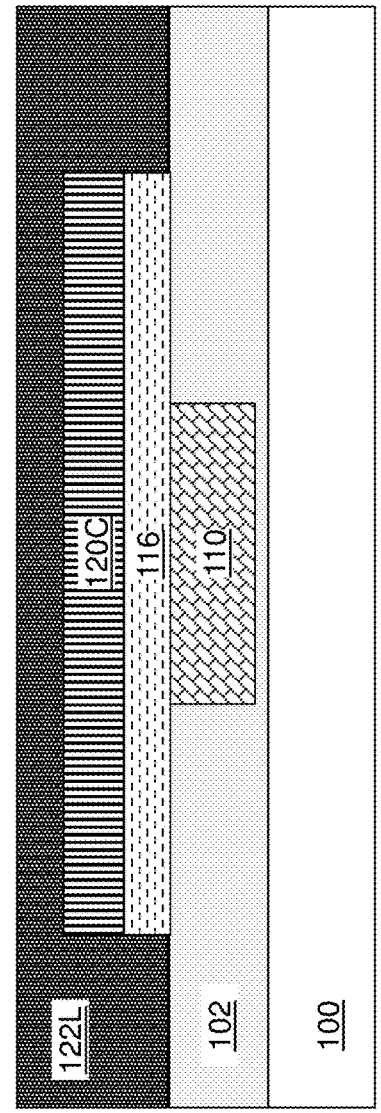
FIG. 7B is a vertical cross-sectional view taken along line A-A' of FIG. 7A according to various embodiments of the present disclosure.

FIG. 7A is a plan view of an intermediate structure of a TFT after the deposition of a hydrogen diffusion barrier film layer over the patterned gate dielectric layer and semiconductor layer according to various embodiments of the present disclosure. FIG. 7B is a vertical cross-sectional view taken along line A-A' of FIG. 7A according to various embodiments of the present disclosure. Referring to FIGS. 7A and 7B, a barrier material blanket layer 122L may be deposited over the semiconductor layer 120 and underlying gate dielectric 116. The barrier material blanket layer 122L may be deposited using any suitable deposition process described herein, such as sputtering, CVD, or the like. The barrier material blanket layer 122L may comprise a dielectric hydrogen diffusion barrier material, such as aluminum oxide ($Al_2O_3$), silicon carbide, silicon oxynitride, stacked silicon dioxide/nitride or the like. However, other dielectric hydrogen diffusion barrier materials are within the scope of the present disclosure.

FIG. 8A is a plan view of an intermediate structure of a TFT after the patterning of the hydrogen diffusion barrier film according to various embodiments of the present disclosure. FIG. 8B is a vertical cross-sectional view taken along line A-A' of FIG. 8A according to various embodiments of the present disclosure. Referring to FIGS. 8A and 8B, the hydrogen diffusion barrier film material layer 122L may be patterned to form a hydrogen diffusion barrier film 122. In particular, a photoresist layer 101 may be applied over the hydrogen diffusion barrier film material layer 122L. The photoresist layer 101 may be lithographically patterned to form a line pattern that includes photoresist material strips that extend along the first horizontal direction hd1. An anisotropic etch process may be performed to etch unmasked portions of the hydrogen diffusion barrier film material layer 122L. A hydrogen diffusion barrier film 122 may be formed extending along the first horizontal direction hd1 in areas that are not masked by the photoresist material strips. The anisotropic etch process may use any suitable etching process, such as a wet or dry etching process. The photoresist layer 101 may be subsequently removed, for example, by ashing. The resulting hydrogen diffusion barrier film 122 may have a thickness ranging from about 1 nm to about 200 nm, such as from about 1 nm to about 20 nm, although thicker or thinner hydrogen diffusion barrier films may be used.

Figure 9A:
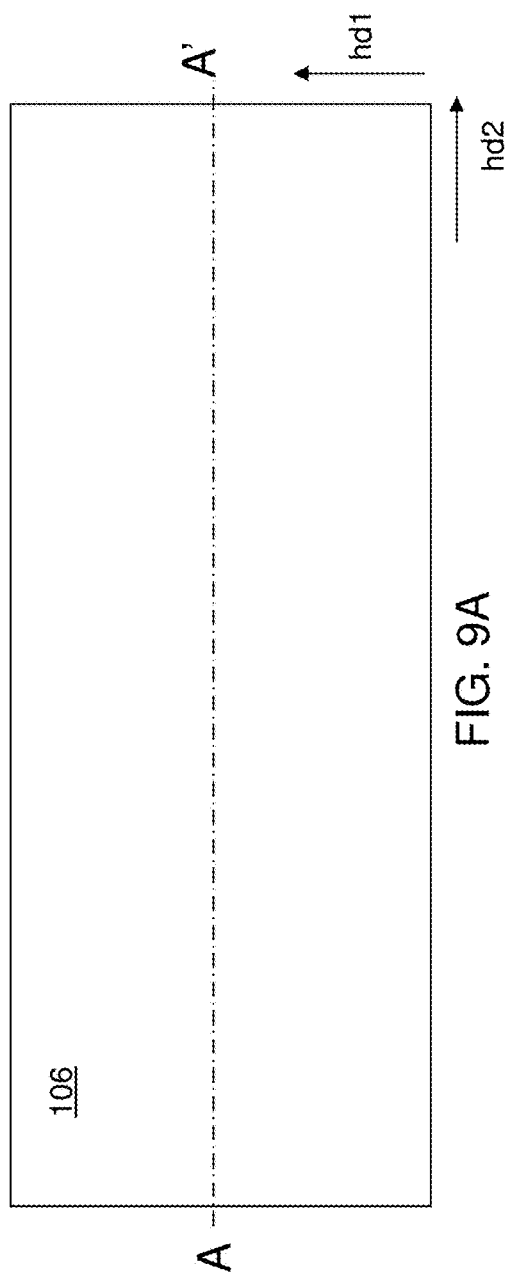
FIG. 9A is a plan view of an intermediate structure of a TFT after the deposition of a second dielectric layer according to various embodiments of the present disclosure.
Figure 9B:
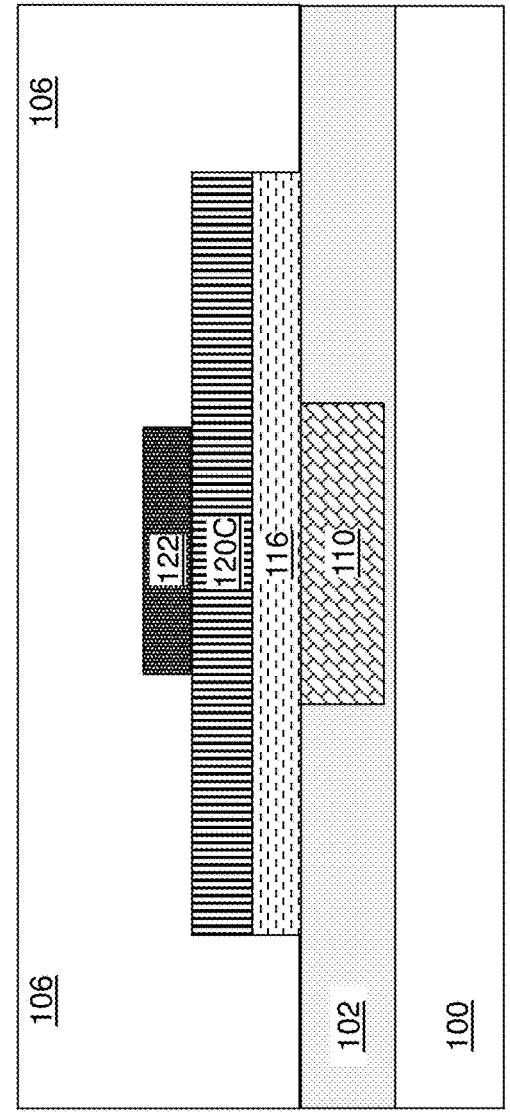
FIG. 9B is a vertical cross-sectional view taken along line A-A' of FIG. 9A according to various embodiments of the present disclosure.

FIG. 9A is a plan view of an intermediate structure of a TFT after the deposition of a second dielectric layer according to various embodiments of the present disclosure. FIG. 9B is a vertical cross-sectional view taken along line A-A' of FIG. 9A according to various embodiments of the present disclosure. Referring to FIGS. 9A and 9B, a second dielectric layer 106 may be deposited on the hydrogen diffusion barrier film 122, semiconductor layer 120, gate dielectric layer 116, and the first dielectric layer 102. In particular, the second dielectric layer 106 may be formed by depositing any suitable dielectric material, using any suitable deposition process, as described herein. For example, in some embodiments, the second dielectric layer 106 may be formed of silicon dioxide ($SiO_2$), silicon nitride ($Si_3N_4$), and/or silicon oxynitride ($SiN_xO_y$). Other suitable dielectric layer materials are within the contemplated scope of disclosure. The second dielectric layer 106 material may be the same or different from the first dielectric layer 102 material. The second dielectric layer 106 substantially embeds the TFT device.

Figure 10:
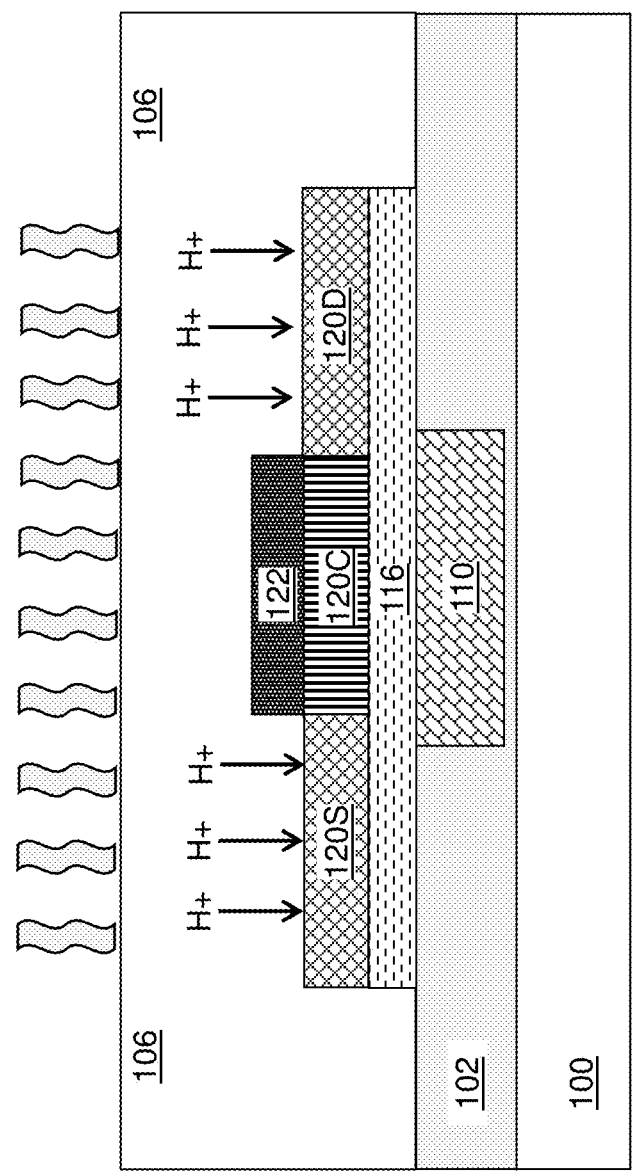
FIG. 10 is a vertical cross sectional view of a TFT during an annealing process step to form active regions according to various embodiments of the present disclosure.

FIG. 10 is a vertical cross sectional view of a TFT during an annealing process step to form active regions according to various embodiments of the present disclosure. Referring to FIG. 10, the embedded structure illustrated in FIGS. 9A and 9B may undergo an annealing process. The annealing process diffuses hydrogen into portions of the semiconductor layer 120 to form active drain region 120D and source region 120S. In particular, the embedded structure illustrated in FIGS. 9A and 9B may be heated to a temperature of at least 100° C., such as a temperature ranging from about 100° C. to about 300° C. In various embodiments, the annealing process may be performed in an atmosphere containing hydrogen gas ($H_2$), or in an atmosphere containing $H_2$ and nitrogen gas ($N_2$). In some embodiments, the annealing may be performed in an inert atmosphere, and the second dielectric layer 106 may include trapped hydrogen.

The hydrogen may diffuse through the second dielectric layer 106 and into opposing portions of the semiconductor layer 120, to form N+ doped source and drain regions 120S,

120D. The hydrogen diffusion barrier film 122 may block ambient hydrogen from diffusing into a semiconductor layer 120 area. As such, a semiconducting channel region 120C may be formed in the semiconductor layer 120, below the hydrogen diffusion barrier film 122, between the source and drain regions 120S, 120D. In this manner, a self-aligning process may be used to form the active regions. In particular, the source and drain regions 120S, 120D may have a higher hydrogen content (e.g., doping level) than the channel region 120C.

Figure 11A:
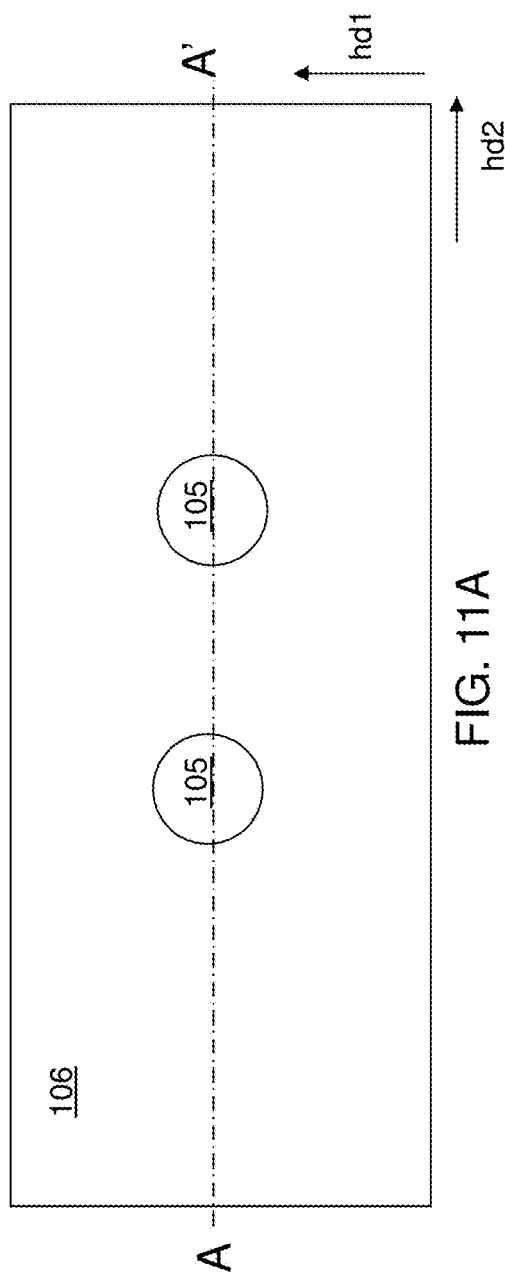
FIG. 11A is a plan view of an intermediate structure of a TFT after the formation of active region electrode via cavities according to various embodiments of the present disclosure.
Figure 11B:
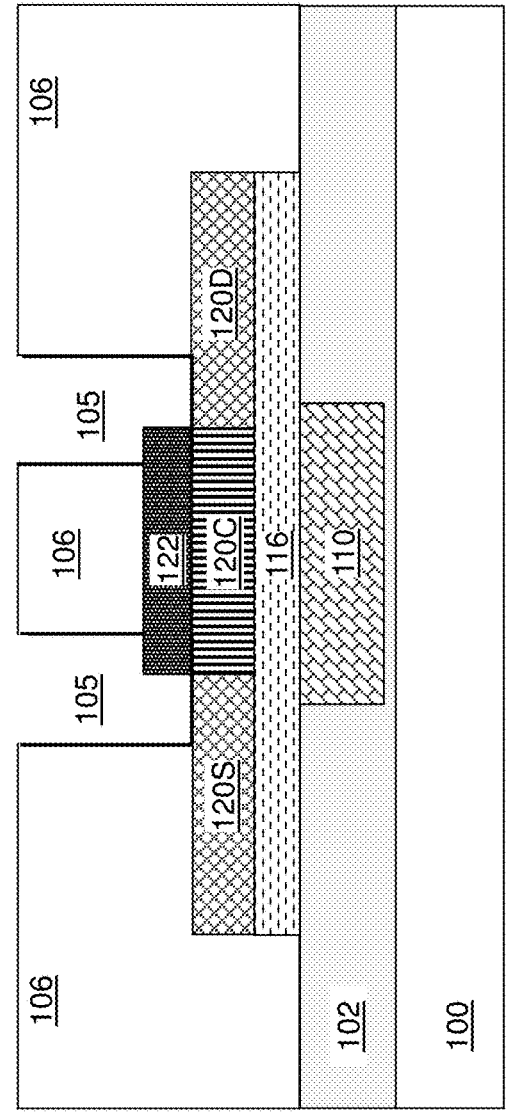
FIG. 11B is a vertical cross-sectional view taken along line A-A' of FIG. 11A according to various embodiments of the present disclosure.

FIG. 11A is a plan view of an intermediate structure of a TFT after the formation of active region electrode via cavities according to various embodiments of the present disclosure. FIG. 11B is a vertical cross-sectional view taken along line A-A' of FIG. 11A according to various embodiments of the present disclosure. Referring to FIGS. 11A and 11B, the second dielectric layer 106 may be patterned to form active region electrode via cavities 105. In particular, a photoresist layer (not shown) may be applied over the second dielectric layer 106. The photoresist layer may be lithographically patterned to form a pattern that includes via spaces. The patterned photoresist layer may be patterned to exhibit any of a variety of via spaces. For example, while a substantially circular via space is shown in FIGS. 11A and 11B, square, rectangular or any closed polygon shape may be used. An anisotropic etch process may be performed to etch unmasked portions of the second dielectric layer 106. An active region electrode via cavity 105 may be formed extending from a top surface of the second dielectric layer 106 through to expose a portion of active source region 120S and active drain region 120D. In some embodiments, the active region electrode via cavities 105 may overlap with the hydrogen diffusion barrier film 122. Thus, sidewall and top surface portions of the hydrogen diffusion barrier film 122 may be exposed in the bottom of active region electrode via cavities 105. The anisotropic etch process may use any suitable etching process, such as a wet or dry etching process. The photoresist layer (not shown) may be subsequently removed, for example, by ashing.

Figure 12A:
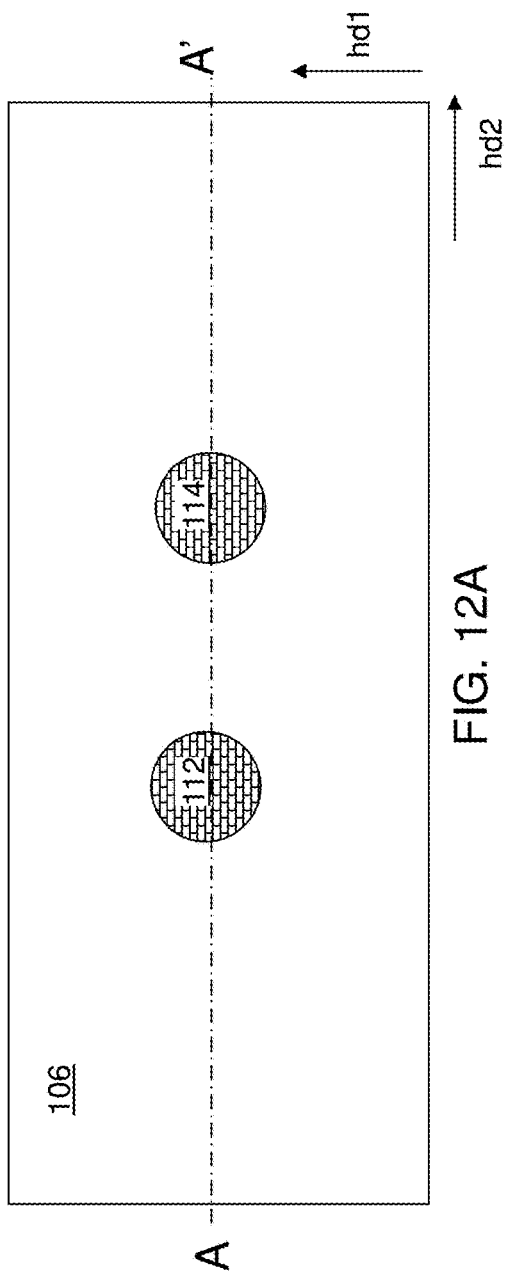
FIG. 12A is a plan view of a completed structure of a TFT after the formation of active region electrodes according to various embodiments of the present disclosure.
Figure 12B:
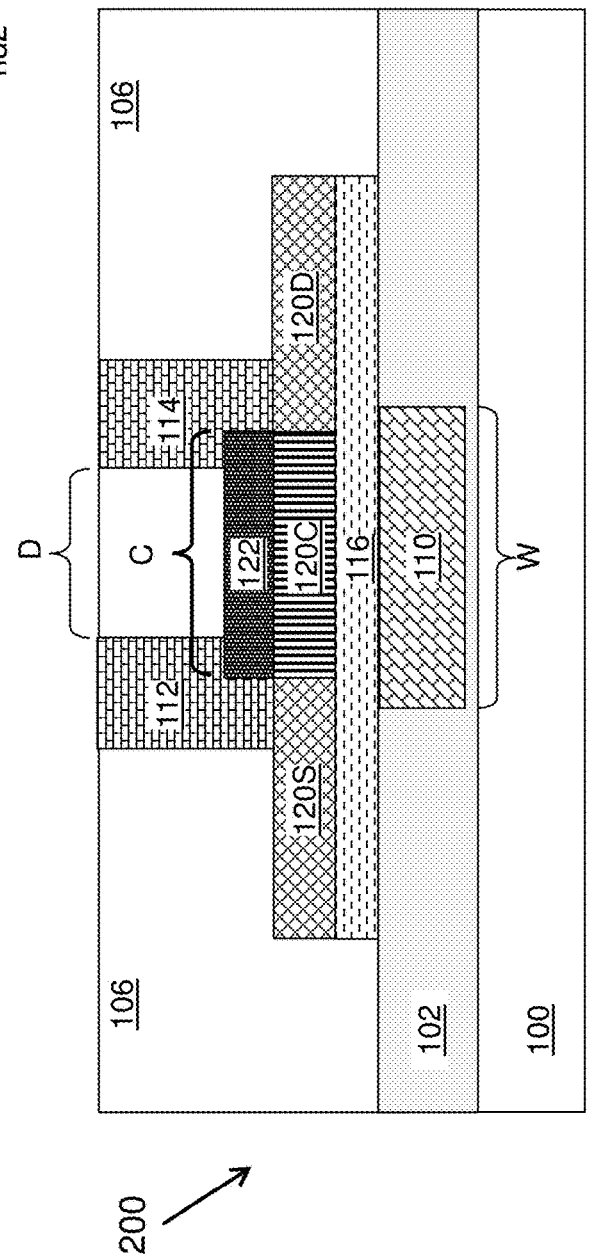
FIG. 12B is a vertical cross-sectional view taken along line A-A' of FIG. 12A according to various embodiments of the present disclosure.

FIG. 12A is a plan view of a completed structure of a TFT after the formation of active region electrodes according to various embodiments of the present disclosure. FIG. 12B is a vertical cross-sectional view taken along line A-A' of FIG. 12A according to various embodiments of the present disclosure. Referring to FIGS. 12A, and 12B, a source electrode 112 (e.g., source line) and a drain electrode 114 (e.g., bit line) may be formed in the active region electrode via cavities 105. In particular, an electrically conductive metallic fill material may be deposited over the second dielectric layer 106 and in the active region electrode via cavities 105. A planarization process may then be performed, such as CMP, in order to remove any excess electrically conductive metallic fill material. The planarization process may provide a top surface of the source electrode 112 (e.g., source line) and the drain electrode 114 (e.g., bit line), and top surface of the second dielectric layer 106 to be co-planar. In some embodiments a metallic liner (not shown) such as TiN may be conformally deposited in the active region electrode via cavities 105 prior to the deposition of the electrically conductive metallic fill material in order to provide better electrical connectivity between the source electrode 112 and drain electrode 114 and respective active source region 120S and drain region 120D. A completed back-gated TFT 200 consistent with various embodiments of the present disclosure may be formed on the substrate 100.

Figure 13:
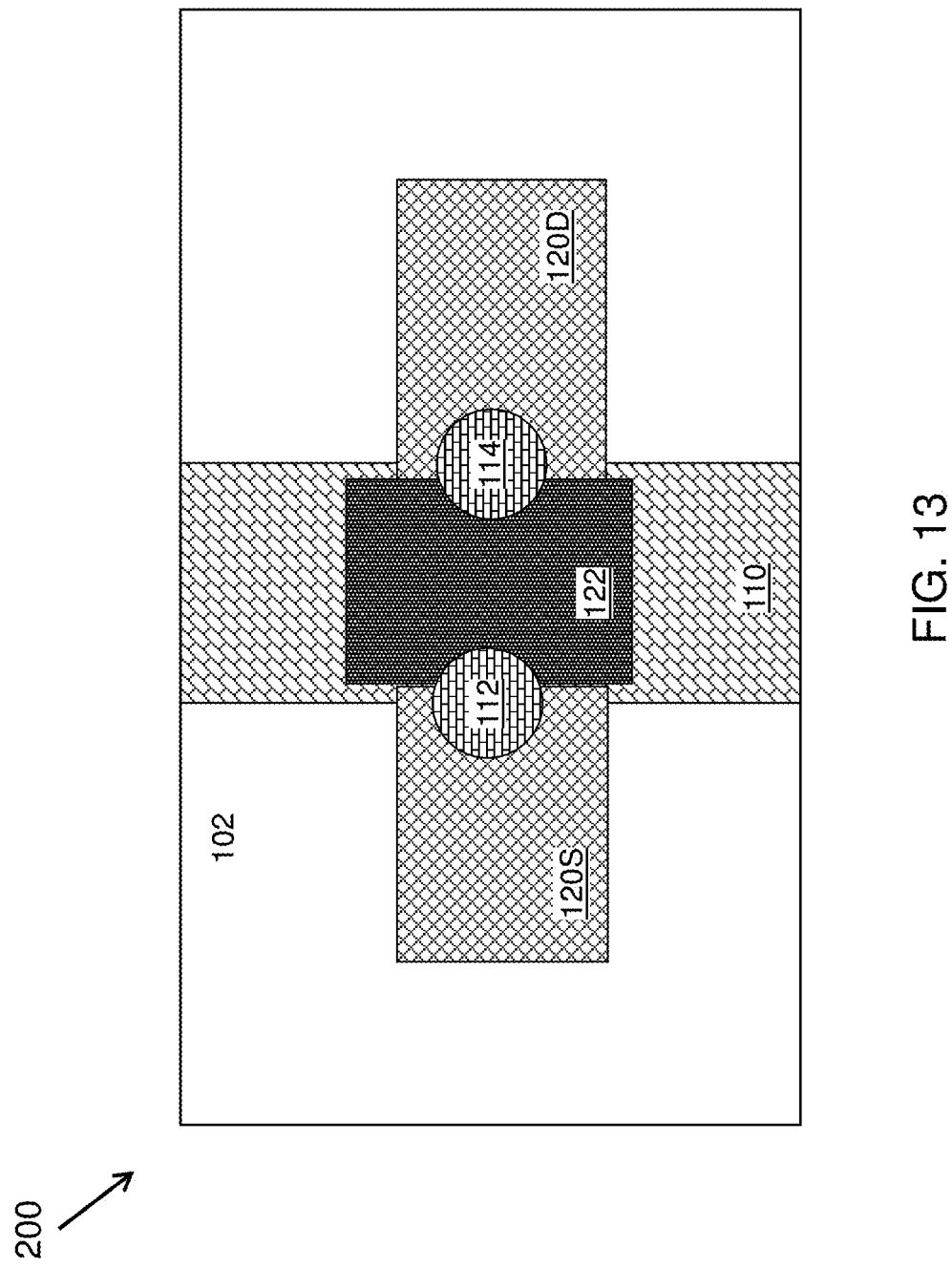
FIG. 13 is a plan semi-transparent view of a completed structure of a TFT after the formation of active region electrodes according to various embodiments of the present disclosure.

FIG. 13 is a plan semi-transparent view of a completed structure of a TFT 200 after the formation of active region electrodes according to various embodiments of the present disclosure. Referring to FIGS. 12A, 12B and 13, the source electrode 112 and drain electrode 114 may overlap portions of the channel region 120C and the word line 110, in a vertical direction perpendicular to a plane of the substrate 100. In other words a separation distance D between the source electrode 112 and drain electrode 114 may be less than a width C of the channel region 120C. The separation distance D between the source electrode 112 and drain electrode 114 may also be less than a width W of the word line 110. The source electrode 112 and drain electrode 114 may be respectively electrically connected to the source region 120S and drain region 120D, respectively.

Figure 14A:
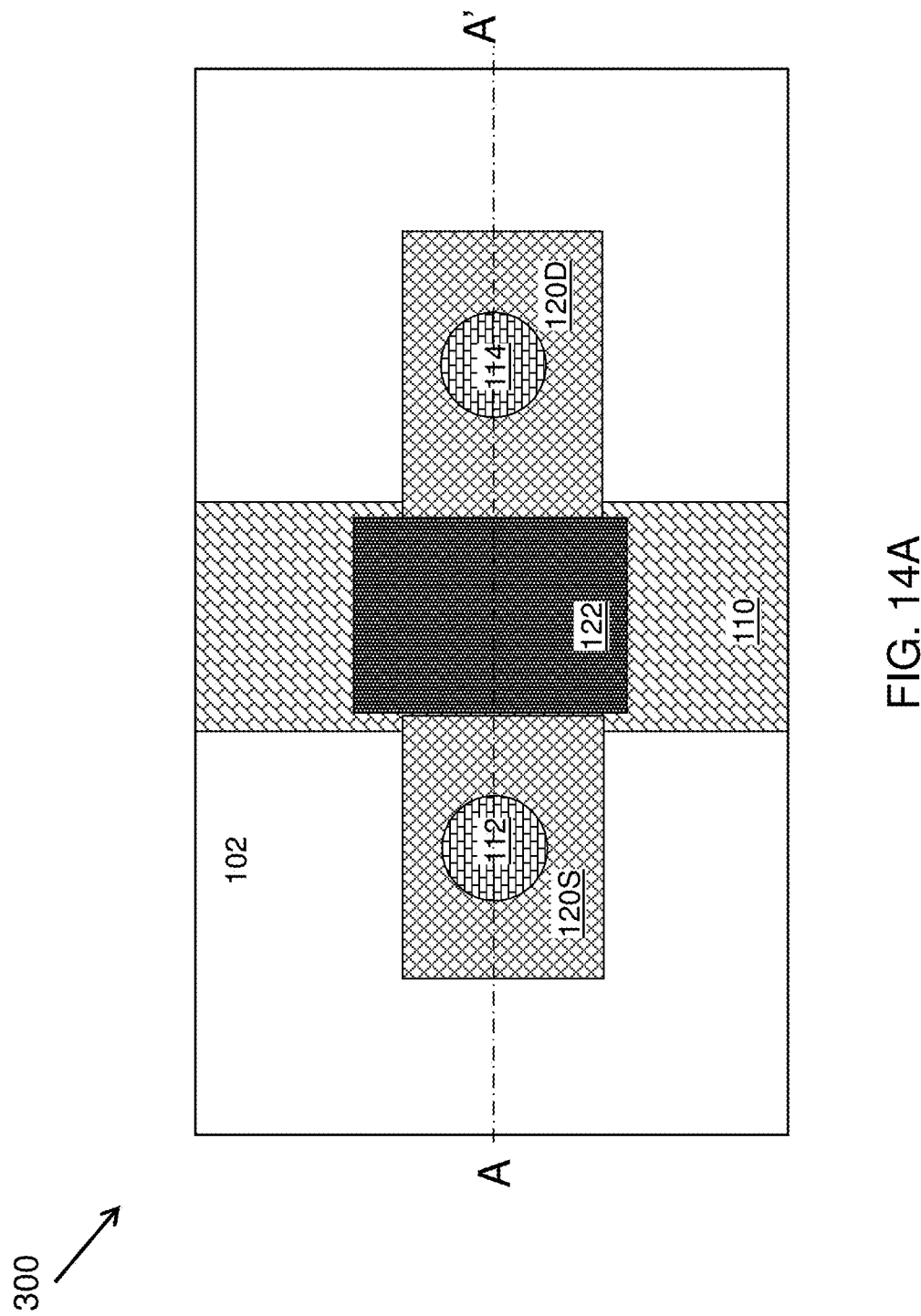
FIG. 14A is a plan semi-transparent view of a completed structure of an alternative TFT after the formation of active region electrodes according to various embodiments of the present disclosure.
Figure 14B:
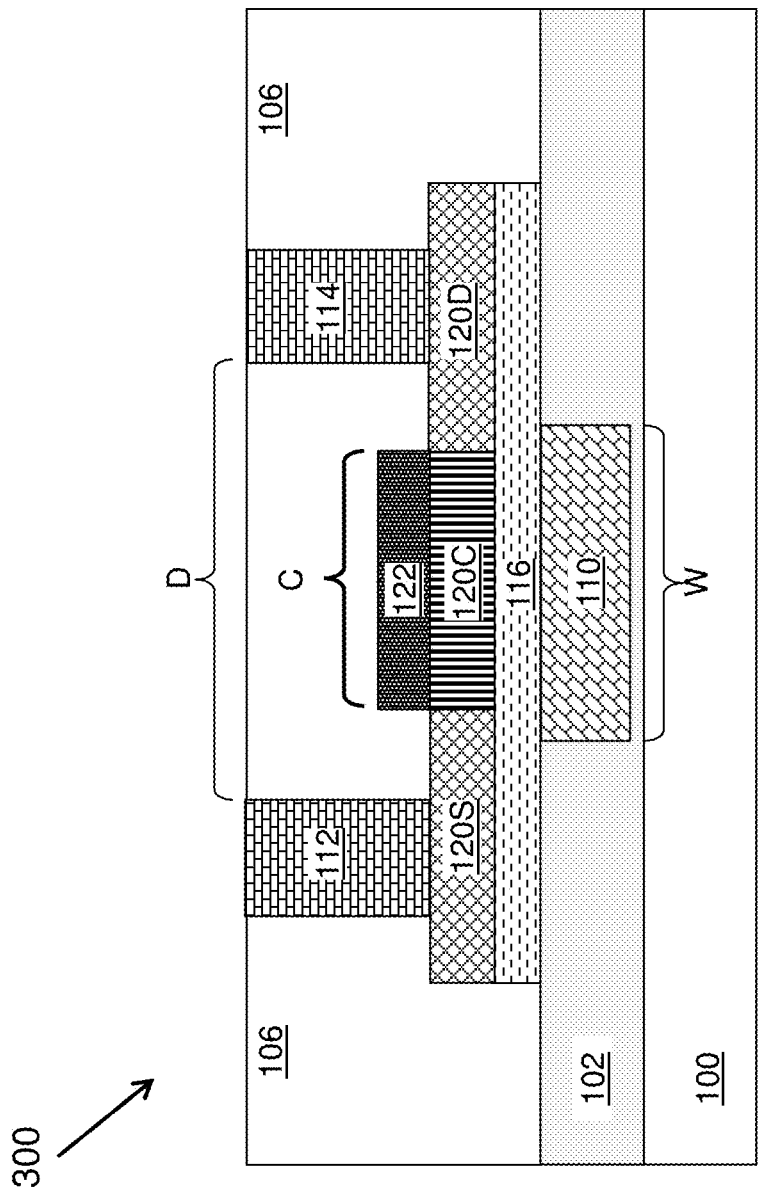
FIG. 14B is a vertical cross-sectional view taken along line A-A' of FIG. 14A according to various embodiments of the present disclosure.

FIG. 14A is a plan semi-transparent view of a completed structure of a back-gated TFT 300, according to various embodiments of the present disclosure. FIG. 14B is a vertical cross-sectional view taken along line A-A' of FIG. 14A. Referring to FIGS. 14A and 14B, the patterned photoresist layer that is used to form active region electrode via cavities 105 may be modified such that a separation distance D between the source and drain electrodes 112, 114 is greater than the width W of the word line 110. In particular, the source and drain electrodes 112, 114 may vertically overlap with the source and drain regions 120S, 120D, but may not vertically overlap with the word line 110 or the channel region 120C. A width C of the channel region 120C may be equal to or less than the width W of the word line 110.

In alternative embodiments a front-gated TFT 400 may be formed with a hydrogen diffusion barrier film to prevent hydrogen from inadvertently diffusing into a channel region 120C. For example, in the alternative embodiment to form a front-gated TFT, the intermediate structure formed above in FIGS. 2A and 2B may be used in the alternative embodiment. FIG. 15A is a plan view of an intermediate structure of a TFT after the deposition of a metallic fill material in the source line trench and drain line trench to form a source line and drain line according to various alternative embodiments of the present disclosure. FIG. 15B is a vertical cross-sectional view taken along line A-A' of FIG. 15A according to various alternative embodiments of the present disclosure. Referring to FIGS. 15A and 15B, a photoresist layer (not shown) may be applied over the first dielectric layer 102. In front-gated TFT embodiments, the first dielectric layer 102 may comprise a dielectric hydrogen diffusion barrier material, such as aluminum oxide ($Al_2O_3$), silicon carbide, silicon oxynitride, stacked silicon dioxide/nitride or the like. The photoresist layer may be lithographically patterned to form a line and space pattern that includes photoresist material strips that extend along the first horizontal direction hd1 with a periodicity along a second horizontal direction hd2. An anisotropic etch process may be performed to etch unmasked portions of the first dielectric layer 102. A source line trench (not shown) and bit (drain) line trench (not shown) extending along the first horizontal direction hd1 may be formed in areas that are not masked by the photoresist material strips. The anisotropic etch process may use any suitable etching process, such as a wet or dry etching process. The photoresist layer may be subsequently removed, for example, by ashing.

An electrically conductive metallic fill material layer may be deposited over first dielectric layer 102 and in source line trench and drain line trench to form source line 112 and bit (drain) line 114 within the first dielectric layer 102. Excess electrically conductive metallic fill material may be removed in a planarization process, such as a CMP such that the top surfaces of the source line 112 and bit (drain) line 114 are co-planar with the top surface of first dielectric layer 102.

Figure 16A:
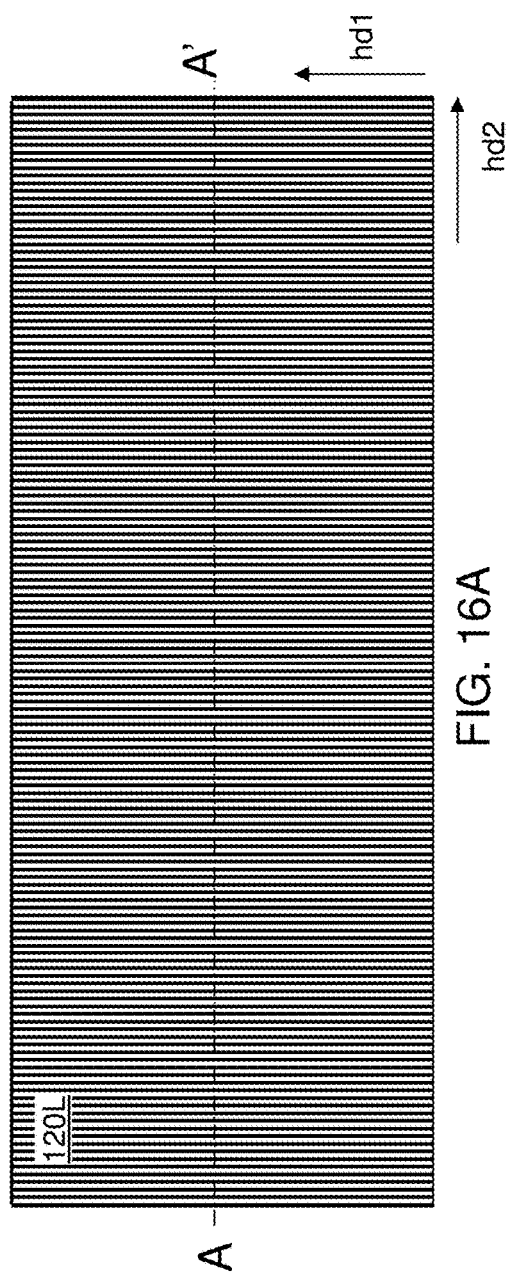
FIG. 16A is a plan view of an intermediate structure of a TFT after the deposition of a semiconductor blanket layer over the source line and drain line according to various alternative embodiments of the present disclosure.
Figure 16B:
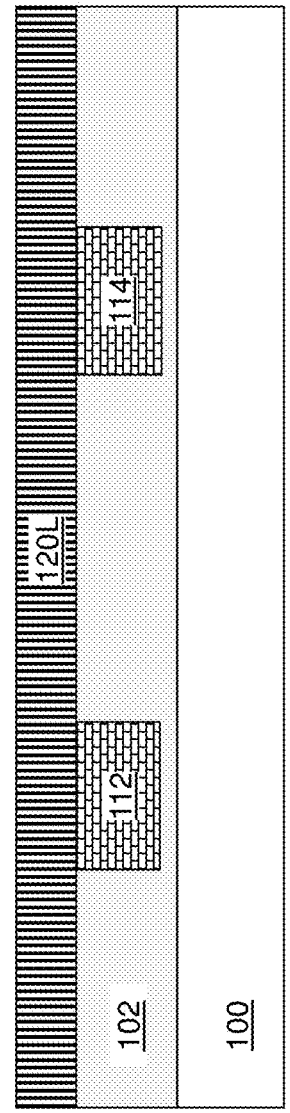
FIG. 16B is a vertical cross-sectional view taken along line A-A' of FIG. 16A according to various alternative embodiments of the present disclosure.

FIG. 16A is a plan view of an intermediate structure of a front-gated TFT after the deposition of a semiconductor blanket layer over the source line and drain line according to various alternative embodiments of the present disclosure. FIG. 16B is a vertical cross-sectional view taken along line A-A' of FIG. 16A according to various alternative embodiments of the present disclosure. Referring to FIGS. 16A and 16B, a semiconductor material blanket layer 120L may be formed on the first dielectric layer 102, covering the source line and bit (drain) line 114. The semiconductor material blanket layer 120L may comprise any suitable semiconductor material, such as amorphous silicon, polysilicon, or a metal oxide semiconductor material, such as InGaZnO (IGZO), indium tin oxide (ITO), InWO, InZnO, InSnO, GaOx, $InO_x$, or the like. However, other suitable semiconductor materials are within the contemplated scope of the present disclosure.

Figure 17A:
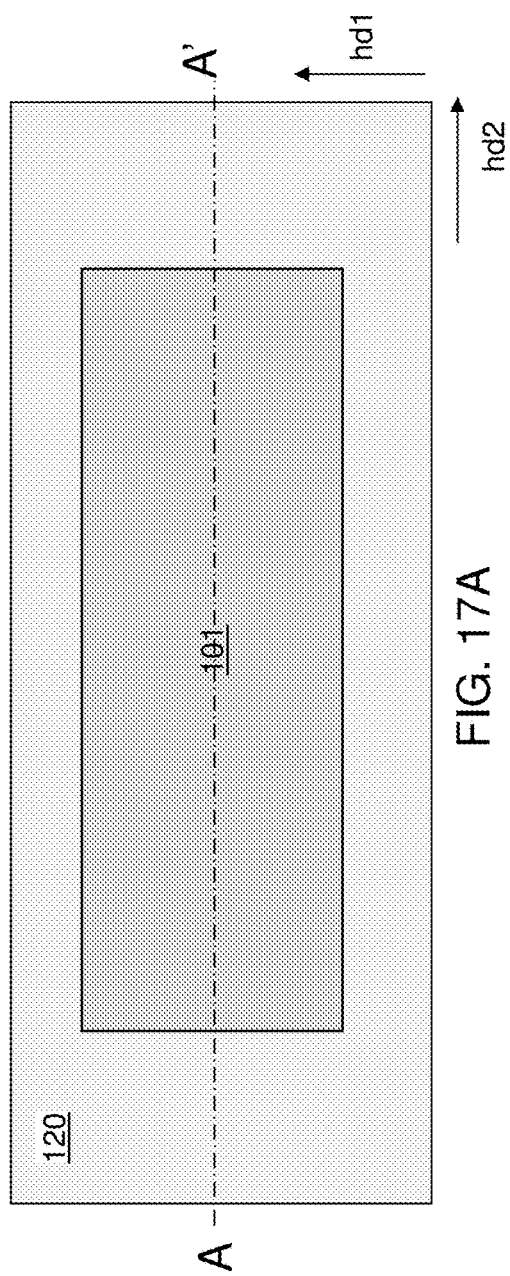
FIG. 17A is a plan view of an intermediate structure of a TFT after the patterning of a semiconducting channel over the source line and drain line according to various alternative embodiments of the present disclosure.
Figure 17B:
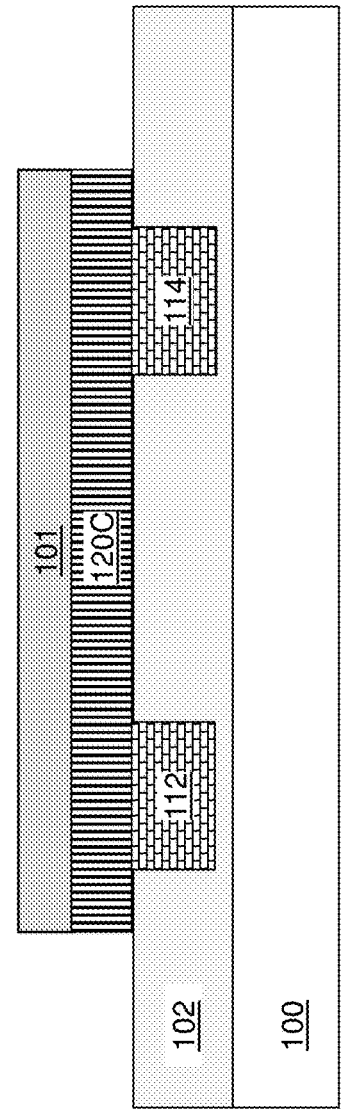
FIG. 17B is a vertical cross-sectional view taken along line A-A' of FIG. 17A according to various alternative embodiments of the present disclosure.

FIG. 17A is a plan view of an intermediate structure of a TFT after the patterning of a semiconducting channel over the source line and drain line according to various alternative embodiments of the present disclosure. FIG. 17B is a vertical cross-sectional view taken along line A-A' of FIG. 17A according to various alternative embodiments of the present disclosure. Referring to FIGS. 17A and 17B, the semiconductor material blanket layer 120L may be patterned to form a semiconductor layer 120. In particular, a photoresist layer 101 may be applied over the semiconductor material blanket layer 120L. The photoresist layer 101 may be lithographically patterned to form a line pattern that includes photoresist material strips that extend along the second horizontal direction hd2. An anisotropic etch process may be performed to etch unmasked portions of the semiconductor material blanket layer 120L. A channel region 120C may be formed, extending along the second horizontal direction hd2 in areas that are not masked by the photoresist material strips. The anisotropic etch process may use any suitable etching process, such as a wet or dry etching process. The photoresist layer 101 may be subsequently removed, for example, by ashing.

Figure 18A:
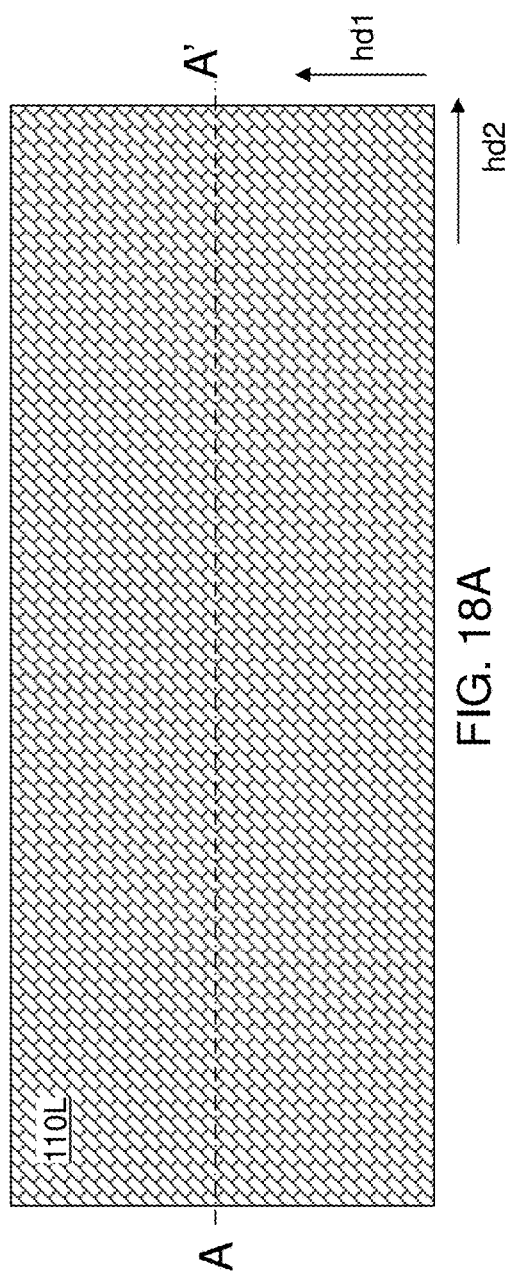
FIG. 18A is a plan view of an intermediate structure of a TFT after the deposition of a hydrogen diffusion barrier film layer, gate dielectric blanket layer and word line blanket layer over the semiconducting channel according to various alternative embodiments of the present disclosure.
Figure 18B:
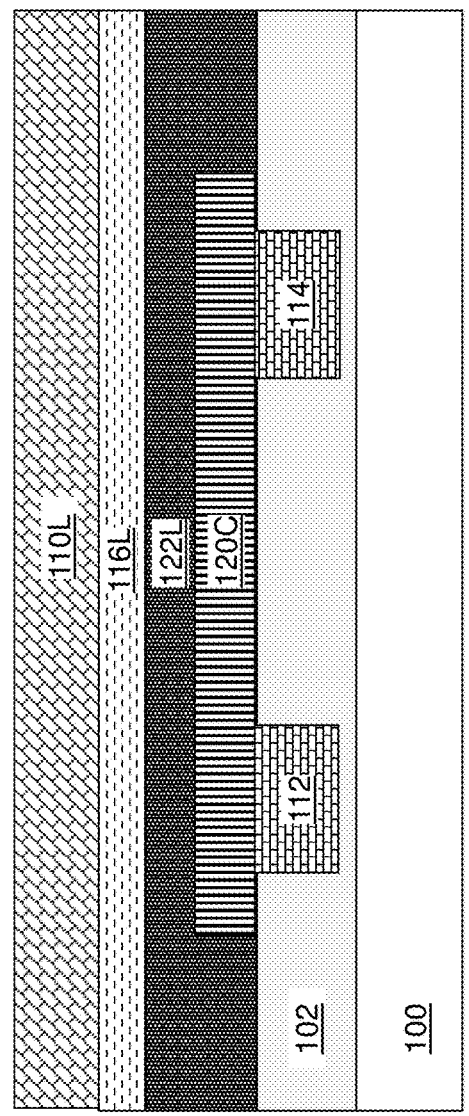
FIG. 18B is a vertical cross-sectional view taken along line A-A' of FIG. 18A according to various embodiments of the present disclosure.

FIG. 18A is a plan view of an intermediate structure of a TFT after the deposition of a hydrogen diffusion barrier film layer, gate dielectric blanket layer and word line blanket layer over the semiconducting channel according to various alternative embodiments of the present disclosure. FIG. 18B is a vertical cross-sectional view taken along line A-A' of FIG. 18A according to various embodiments of the present disclosure. Referring to FIGS. 18A and 18B, a hydrogen diffusion barrier material blanket layer 122L, a gate dielectric material blanket layer 116L, and a conductive word line gate material blanket layer 110L may be sequentially deposited over the first semiconductor layer 102 and channel region 120C. The layers 122L, 116L, 110L may be formed of materials and using deposition methods, as described above. For example, the hydrogen diffusion barrier material blanket layer 122L may comprise $Al_2O_3$, the gate dielectric material layer 116L may comprise a dielectric material, and the conductive word line gate material blanket layer 110L may comprise a electrically conductive metal material as discussed above.

Figure 19A:
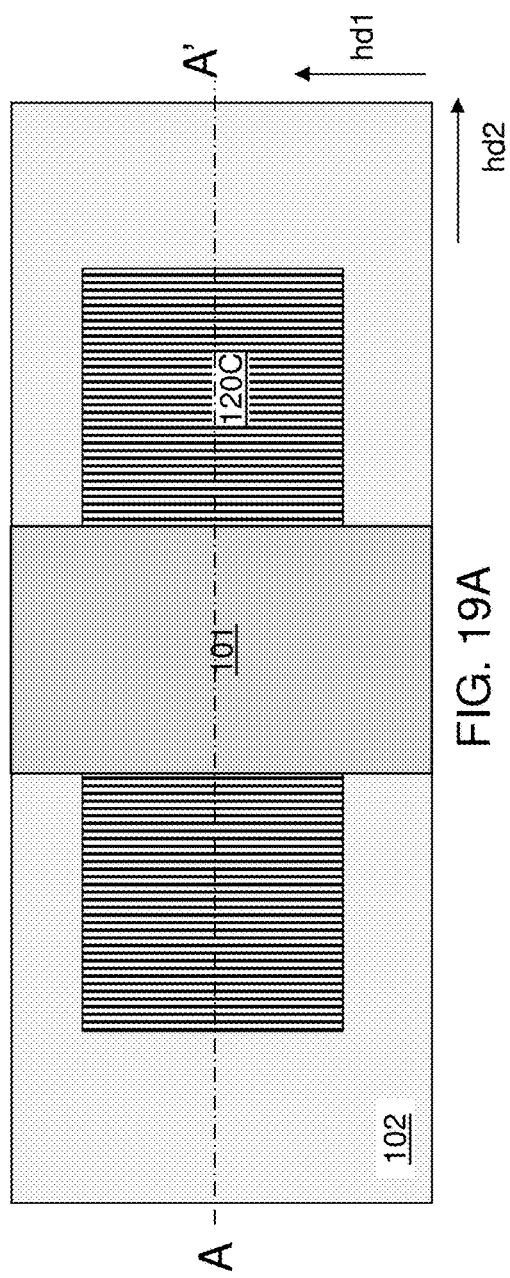
FIG. 19A is a plan view of an intermediate structure of a TFT after the patterning of the hydrogen diffusion barrier film, gate dielectric layer and word line according to various alternative embodiments of the present disclosure.
Figure 19B:
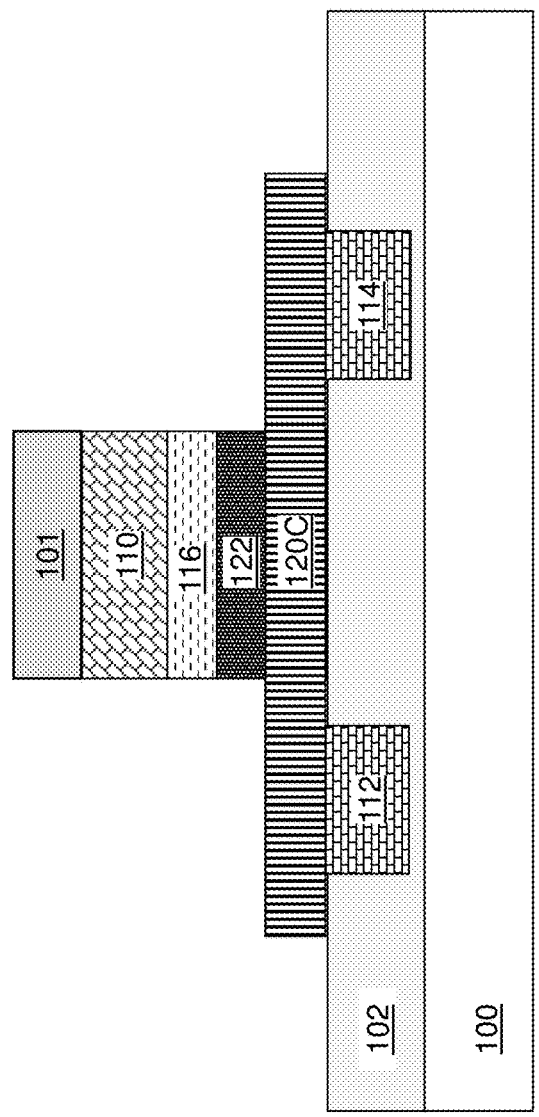
FIG. 19B is a vertical cross-sectional view taken along line A-A' of FIG. 19A according to various embodiments of the present disclosure.

FIG. 19A is a plan view of an intermediate structure of a front-gated TFT after the patterning of the hydrogen diffusion barrier film, gate dielectric layer and word line according to various alternative embodiments of the present disclosure. FIG. 19B is a vertical cross-sectional view taken along line A-A' of FIG. 19A according to various embodiments of the present disclosure. Referring to FIGS. 19A and 19B, the hydrogen diffusion barrier blanket layer 122L, gate dielectric material blanket layer 116L, and conductive word line gate material blanket layer 110L may be patterned to form a hydrogen diffusion barrier film 122, a gate dielectric layer 116, and a word line 110 (e.g., gate electrode). In particular, a photoresist layer 101 may be applied over the conductive word line gate material blanket layer 110L and underlying gate dielectric material blanket layer 116L and hydrogen diffusion barrier blanket layer 122L. The photoresist layer 101 may be lithographically patterned to form a line pattern that includes photoresist material strips that extend along the first horizontal direction hd1. An anisotropic etch process may be performed to etch unmasked portions of the hydrogen diffusion barrier blanket layer 122L, gate dielectric material blanket layer 116L, and conductive word line gate material blanket layer 110L. A hydrogen diffusion barrier film 122, gate dielectric layer 116 and word line 110 may be formed, extending along the first horizontal direction hd1 in areas that are not masked by the photoresist material strips. The anisotropic etch process may use any suitable etching process, such as a wet or dry etching process. The photoresist layer 101 may be subsequently removed, for example, by ashing.

Figure 20A:
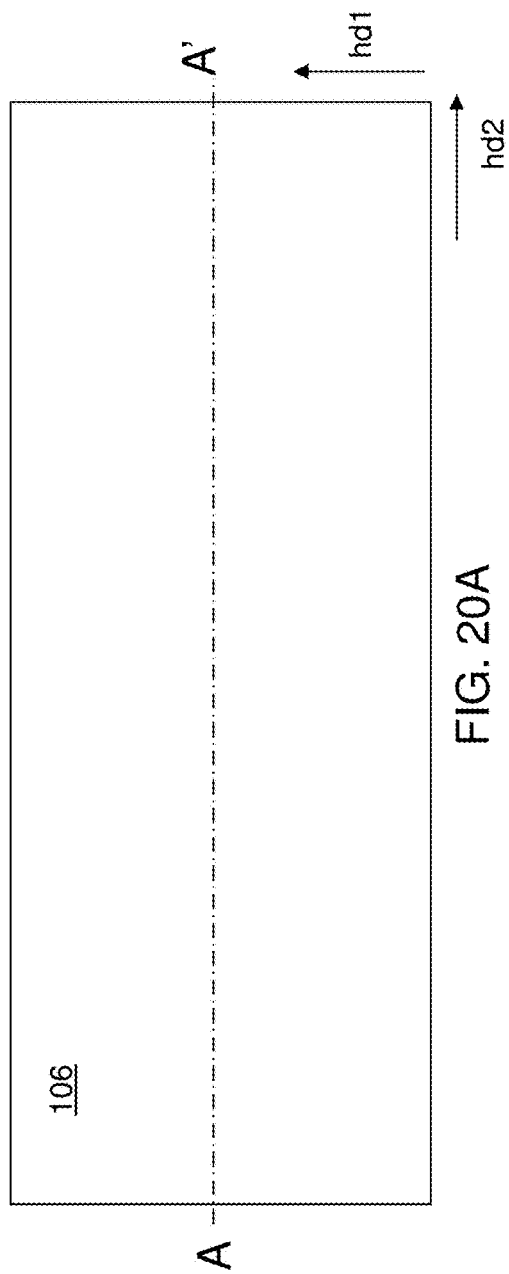
FIG. 20A is a plan view of an intermediate structure of a TFT after the deposition of a second dielectric layer according to various alternative embodiments of the present disclosure.
Figure 20B:
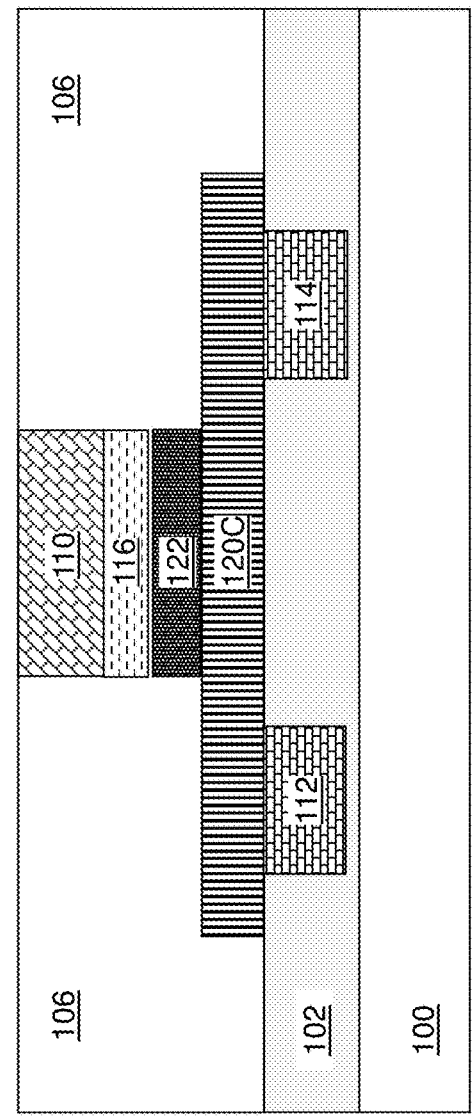
FIG. 20B is a vertical cross-sectional view taken along line A-A' of FIG. 20A according to various alternative embodiments of the present disclosure.

FIG. 20A is a plan view of an intermediate structure of a front-gated TFT after the deposition of a second dielectric layer according to various alternative embodiments of the present disclosure. FIG. 20B is a vertical cross-sectional view taken along line A-A' of FIG. 20A according to various alternative embodiments of the present disclosure. Referring to FIGS. 20A and 20B, a second dielectric layer 106 may be deposited on the hydrogen diffusion barrier film 122, semiconductor layer 120, gate dielectric layer 116, and the first dielectric layer 102. In particular, the second dielectric layer 106 may be formed by depositing any suitable dielectric material, using any suitable deposition process, as described herein. For example, in some embodiments, the second dielectric layer 106 may be formed of silicon dioxide ($SiO_2$), silicon nitride ($Si_3N_4$), and/or silicon oxynitride ($SiN_xO_y$). Other suitable dielectric layer materials are within the contemplated scope of disclosure. The second dielectric layer 106 material may be the same or different from the first dielectric layer 102 material. The second dielectric layer 106 substantially embeds the front-gated TFT device. A planarization process, such as a CMP, may be performed to remove any excess portion of the second dielectric layer 106. The top surface of the second dielectric layer 106 and the top surface of a word line 110 may be co-planar.

Figure 21:
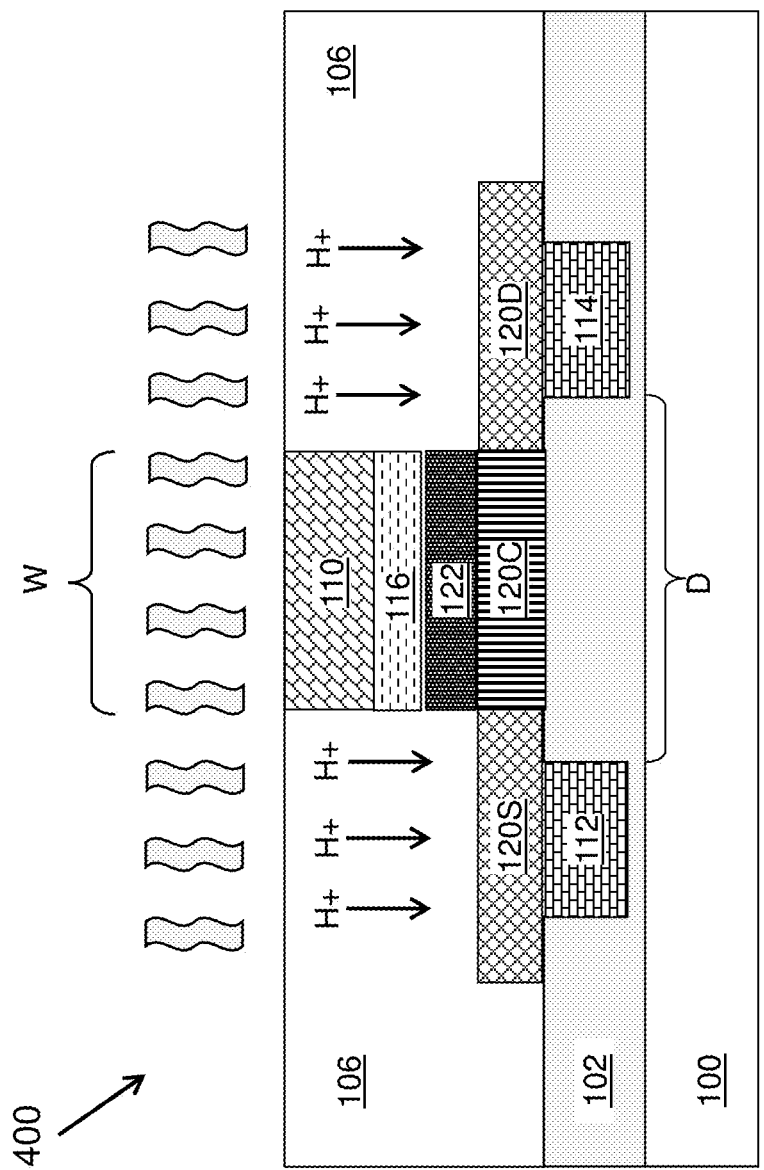
FIG. 21 is a vertical cross sectional view of a TFT during an annealing process step to form active regions according to various alternative embodiments of the present disclosure.

FIG. 21 is a vertical cross sectional view of a front-gated TFT during an annealing process step to form active regions according to various alternative embodiments of the present disclosure. Referring to FIG. 21, the embedded structure illustrated in FIGS. 20A and 20B may undergo an annealing process. The annealing process diffuses hydrogen into portions of the semiconductor layer 120 to form active drain region 120D and source region 120S. In particular, the embedded structure illustrated in FIGS. 9A and 9B may be heated to a temperature of at least 100° C., such as a temperature ranging from about 100° C. to about 300° C. In various embodiments, the annealing process may be performed in an atmosphere containing hydrogen gas ($H_2$), or in an atmosphere containing $H_2$ and nitrogen gas ($N_2$). In some embodiments, the annealing may be performed in an inert atmosphere, and the second dielectric layer 106 may include trapped hydrogen.

The hydrogen may diffuse through the second dielectric layer 106 and into opposing portions of the semiconductor layer 120, to form N+ doped source and drain regions 120S, 120D. The hydrogen diffusion barrier film 122 may block ambient hydrogen from diffusing into a semiconductor layer 120 area. As such, a semiconducting channel region 120C may be formed in the semiconductor layer 120, below the hydrogen diffusion barrier film 122, between the source and drain regions 120S, 120D. In this manner, a self-aligning process may be used to form the active regions. In particular, the source and drain regions 120S, 120D may have a higher hydrogen content (e.g., doping level) than the channel region 120C. In particular, the channel region 120C may be substantially free of hydrogen doping. As such, at least front-gated TFT 400 may be formed on the substrate 100.

A separation distance D between the source line 112 and bit (drain) line 114 may be greater than a width W of the channel region 120C and word line 110. In other words, the source line 112 and bit (drain) line 114 may not vertically overlap the channel region 120C or the word line 110. The source line 112 and bit (drain) line 114 may be respectively electrically connected to the source region 120S and drain region 120D.

Figure 22:
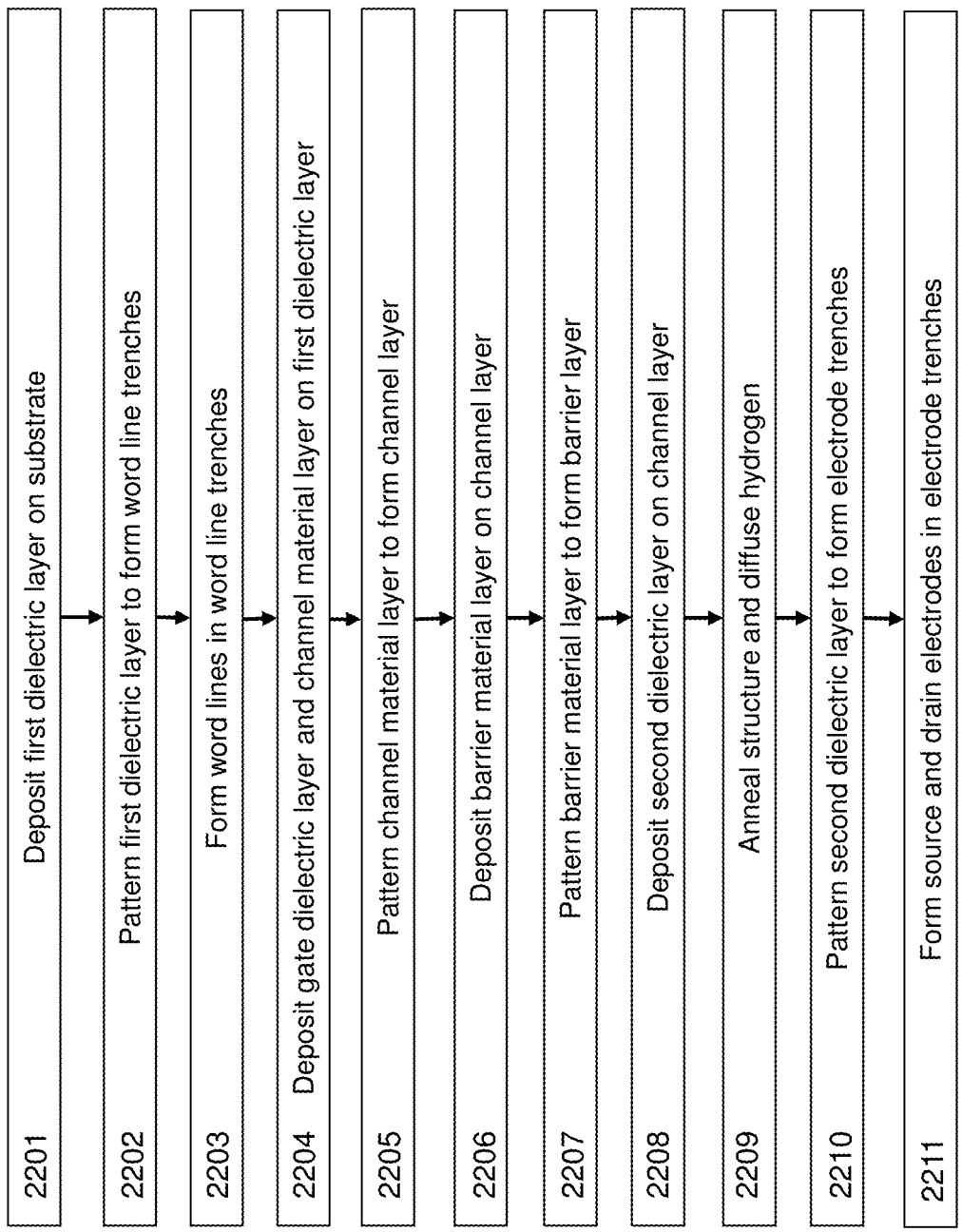
FIG. 22 is a process flow diagram of a method of forming a back gated TFT 200, according to various embodiments of the present disclosure.

FIG. 22 is a process flow diagram of a method of forming a back gated TFT 200, according to various embodiments of the present disclosure. With reference to FIGS. 2A-14B and 22, in operation 2201, a first dielectric layer 102 may be deposited over a substrate 100. In operation 2202, the first dielectric layer 102 may be patterned to form word line trenches 103. In operation 2203, a metallic fill material may be deposited over the first dielectric layer 102 and in the word line trenches 103 to form word line 110. The first dielectric layer 102 and word line 110 may be planarized such that the top surface of the first dielectric layer 102 and the word line are co-planar. In operation 2204, a gate dielectric blanket layer 116L and semiconductor material blanket layer 120L may be sequentially deposited over the first dielectric layer 102 and word lines 110. In operation 2205, the semiconductor material blanket layer 120L and gate dielectric blanket layer 116L may be patterned to form a first channel portion 120 and gate dielectric layer 116. In operation 2206, a hydrogen diffusion barrier blanket layer 122L may be deposited over the first channel portion 120 and gate dielectric layer 116. In operation 2207, the hydrogen diffusion barrier blanket layer 122L may be patterned to form a hydrogen diffusion barrier film 122. In operation 2208, a second dielectric layer 106 may be deposited over the hydrogen diffusion barrier film, semiconducting channel 120 and gate dielectric layer 116. In operation 2209, the entire intermediate structure may be annealed to diffuse ambient hydrogen into portions of the semiconductor layer 120 to form active drain region 120D and source region 120S. In operation 2210, the second dielectric layer 106 may be patterned to form active region electrode via cavities 105. In operation 2211, a metallic fill material may be deposited over the second dielectric layer 106 and in the active region electrode via cavities 105 to form source and drain electrodes 112, 114. The second dielectric layer 106 and source and drain electrodes 112, 114 may be planarized such that the top surface of the second dielectric layer 106 and the source and drain electrodes 112, 114 are co-planar.

Figure 23:
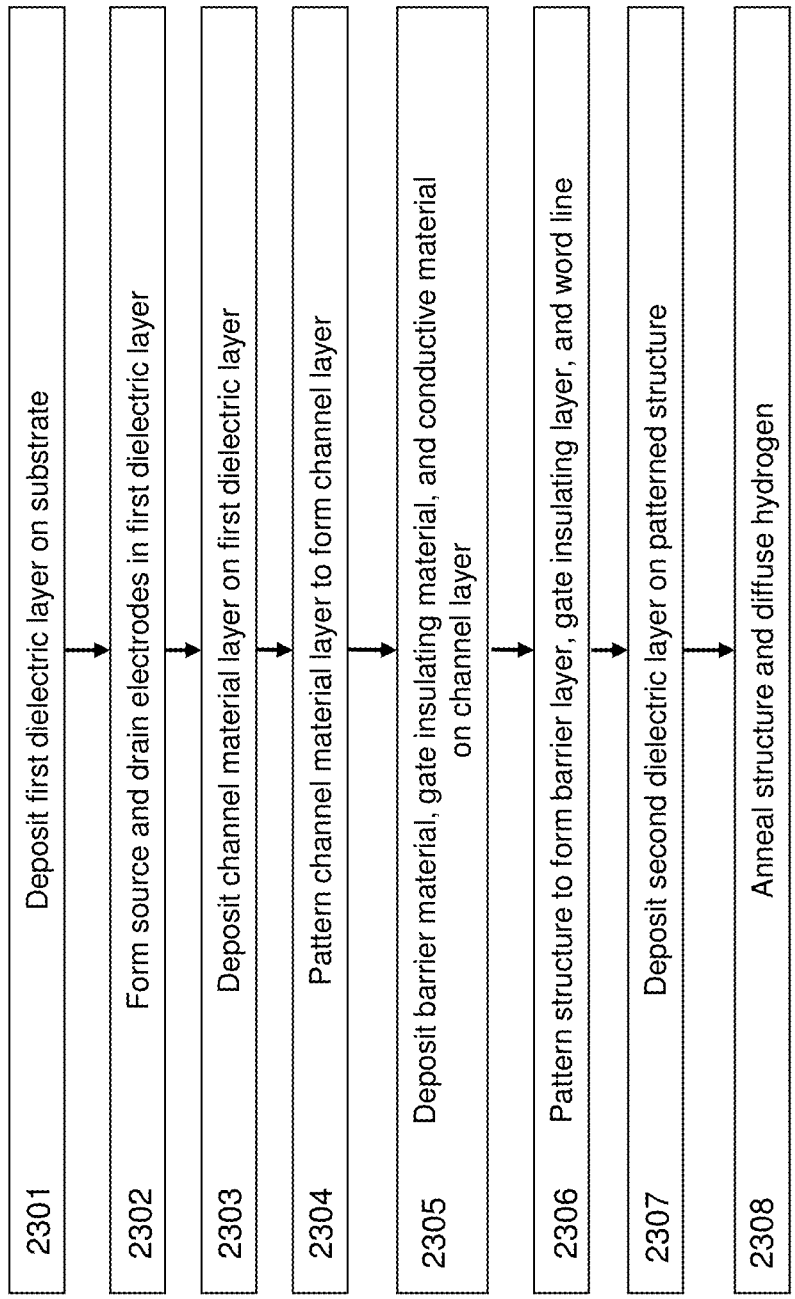
FIG. 23 is a process flow diagram of a method of forming a front-gated TFT 400, according to various alternative embodiments of the present disclosure.

FIG. 23 is a process flow diagram of a method of forming a front-gated TFT 400, according to various alternative embodiments of the present disclosure. With reference to FIGS. 2A, 2B, and 15A-21, in operation 2301, a first dielectric layer 102 may be deposited over a substrate 100. In front-gated TFT embodiments, the first dielectric layer 102 may be formed of a dielectric hydrogen diffusion barrier material, such as aluminum oxide ($Al_2O_3$), silicon carbide, silicon oxynitride, stacked silicon dioxide/nitride or the like. In operation 2302, the first dielectric layer 102 may be patterned to form source line trenches and bit (drain) line trenches 103. A metallic fill material may be deposited over the first dielectric layer 102 and in the source line trenches and bit (drain) line trenches 103 to form source line 112 and bit (drain) line 114. The first dielectric layer 102 and source line 112 and bit (drain) line 114 may be planarized such that the top surface of the first dielectric layer 102 and the source line 112 and bit (drain) line 114 are co-planar. In operation 2303 a semiconductor material blanket layer 120L may be deposited over the first dielectric layer 102 and the source line 112 and bit (drain) line 114. In operation 2304, the semiconductor material blanket layer 120L may be patterned to form a first channel portion 120. In operation 2305, a hydrogen diffusion barrier blanket layer 122L, gate dielectric blanket layer 116L, and conductive word line gate material blanket layer 110L may be sequentially deposited over the first channel portion 120. In operation 2306, the hydrogen diffusion barrier blanket layer 122L, gate dielectric blanket layer 116L, and conductive word line gate material blanket layer 110L may be patterned to form a hydrogen diffusion barrier film 122, gate dielectric layer 116 and word line 110. In operation 2307, a second dielectric layer 106 may be deposited over the word line 110, gate dielectric layer 116, hydrogen diffusion barrier film 122, and semiconducting channel 120. The second dielectric layer 106 and word lines 110 may be planarized such that the top surface of the word line 110 and second dielectric layer 106 are co-planar. In operation 2308, the entire intermediate structure may be annealed to diffuse ambient hydrogen into portions of the semiconductor layer 120 to form active drain region 120D and source region 120S.

According to various embodiments, provided are transistors that include patterned hydrogen diffusion barrier film disposed on a semiconductor layer. The hydrogen diffusion barrier film block hydrogen penetration into a channel region of the semiconductor layer, during an annealing process wherein hydrogen is doped into other portions of the semiconductor layer to form active source and drain regions. As such, the channel region is protected from damage during processing, and the formation of the source and drain regions may be precisely controlled in a self-aligned process.

Referring to all drawings and according to various embodiments of the present disclosure, a thin film transistor (TFT) device is provided. The TFT comprises: a word line 110 disposed on a substrate 100; a semiconductor layer 120 disposed on the substrate 100, the semiconductor layer 120 comprising a source region 120S, a drain region 120D, and a channel region 120C disposed between the source region 120S and drain region 120D and overlapping with the word line 110 in a vertical direction, perpendicular to a plane of the substrate 100; a hydrogen diffusion barrier film 122 overlapping with the channel region 120C in the vertical direction; a gate dielectric layer 116 disposed between the channel region 120C and the word line 110; and a source electrode 112 and a drain electrode 114 electrically coupled to the respective source region 120S and drain region 120D.

In one embodiment, the source region 120S and drain region 120D of the TFT 200 may have a higher hydrogen concentration than the channel region 120C. In another embodiment, the hydrogen diffusion barrier film 122 may have a thickness ranging from about 1 nm to about 200 nm. In another embodiment, the hydrogen diffusion barrier film 122 of the TFT 200 comprises a dielectric material. In another embodiment, the hydrogen diffusion barrier film 122 of the TFT 200 comprises $Al_2O_3$. In another embodiment, a first dielectric layer 102 of the TFT 200 may be disposed between the semiconductor layer 120 and the substrate 100; and a second dielectric layer 106 may be disposed on the first dielectric layer 102, covering the semiconductor layer 120 and the hydrogen diffusion barrier film 122. In another embodiment, the source electrode 112 and drain electrode 114 may be embedded in the second dielectric layer 106; and the word line 110 may be embedded in the first dielectric layer 102. In another embodiment, the source electrode 112 and drain electrode 114 of the TFT 200 may overlap opposing portions of the word line 100 in the vertical direction. In another embodiment, the source electrode 112 and drain electrode 114 may be spaced further apart than a width W of the word line 110. In another embodiment, the hydrogen diffusion barrier film 122 may be disposed between the second dielectric layer 106 and the channel region 120C; and the gate dielectric layer 116 may be disposed between the semiconductor layer 120 and the word line 110. In another embodiment, the source electrode 112 and drain electrode 114 may be embedded in the first dielectric layer 102; and the word line 110 may be embedded in the second dielectric layer 106. In another embodiment, the first dielectric layer 102 may comprise silicon dioxide; and the second dielectric layer 106 may comprise silicon dioxide or silicon nitride. In another embodiment, the TFT 200 may have the source region 120S and drain region 120D formed by a thermal annealing process.

Referring to all drawings and according to various embodiments of the present disclosure, a TFT 400 is provide. The TFT 400 comprises: a word line 110 disposed on a substrate 100; a semiconductor layer 120 disposed on the substrate 100, the semiconductor layer 120 comprising a source region 120S, a drain region 120D, and a channel region 120C disposed between the source region 120S and drain region 120D and overlapping with the word line 110 in a vertical direction perpendicular to a plane of the substrate 100; a hydrogen diffusion barrier film 122 overlapping with the channel region 120C in the vertical direction; a gate dielectric layer 116 disposed between the channel region 120C and the word line 110; a source electrode 112 and a drain electrode 114 electrically coupled to respective the source region 120S and the drain region 120D; a first dielectric layer 102 disposed between the semiconductor layer 120 and the substrate 100; and a second dielectric layer 106 disposed on the first dielectric layer 102, covering the semiconductor layer 120 and the hydrogen diffusion barrier film 122, wherein, the source region 120S and the drain region 120D directly contact the second dielectric layer 106; and the channel region 120C directly contacts the hydrogen diffusion barrier film 122.

Various embodiments provide method of forming a transistor, comprising depositing a first dielectric layer 102 on a substrate 100; forming a semiconductor layer 120 on the first dielectric layer 102; forming a hydrogen diffusion barrier film 122 on a channel region 120C of the semiconductor layer 120; depositing a second dielectric layer 106 on the semiconductor layer 120 and the hydrogen diffusion barrier film 122; and performing a thermal annealing process to diffuse hydrogen into the semiconductor layer 120 to form a source region 120S and a drain region 120D on opposing sides of the channel region 120C.

The foregoing outlines features of several embodiments so that those skilled in the art may better understand the aspects of the present disclosure. Those skilled in the art would appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a word line disposed on a substrate;
a semiconductor layer disposed on the substrate, the semiconductor layer comprising a source region, a drain region, and a channel region disposed between the source region and drain region and overlapping with the word line in a vertical direction, perpendicular to a plane of the substrate;
a hydrogen diffusion barrier film overlapping with the channel region in the vertical direction;
a gate dielectric layer disposed between the channel region and the word line; and
a source electrode and a drain electrode electrically coupled to the respective source region and drain region.

2. The transistor of claim 1, wherein the source and drain regions have a higher hydrogen concentration than the channel region.

3. The transistor of claim 1, wherein a thickness of the hydrogen diffusion barrier film ranges from about 1 nm to about 200 nm.

4. The transistor of claim 1, wherein the hydrogen diffusion barrier film comprises a dielectric material.

5. The transistor of claim 1, wherein the hydrogen diffusion barrier film comprises $Al_2O_3$.

6. The transistor of claim 1, further comprising:
a first dielectric layer disposed between the semiconductor layer and the substrate; and
a second dielectric layer disposed on the first dielectric layer, covering the semiconductor layer and the hydrogen diffusion barrier film.

7. The transistor of claim 6, wherein:
the source electrode and drain electrode are embedded in the second dielectric layer; and
the word line is embedded in the first dielectric layer.

8. The transistor of claim 7, wherein the source electrode and drain electrode overlap opposing portions of the word line in the vertical direction.

9. The transistor of claim 7, wherein the source electrode and drain electrode are spaced further apart than a width of the word line.

10. The transistor of claim 7, wherein:
the hydrogen diffusion barrier film is disposed between the second dielectric layer and the channel region; and
the gate insulating layer is disposed between the semiconductor layer and the word line.

11. The transistor of claim 6, wherein:
the source and drain electrodes are embedded in the first dielectric layer; and
the word line is embedded in the second dielectric layer.

12. The transistor of claim 11, wherein:
the hydrogen diffusion barrier film is disposed between the gate dielectric layer and the channel region; and
the gate dielectric layer is disposed between the hydrogen diffusion barrier film and the word line.

13. The transistor of claim 6, wherein:
the first dielectric layer comprises silicon dioxide; and the second dielectric layer comprises silicon dioxide or silicon nitride.

14. The transistor of claim 1, wherein the semiconductor layer comprises a metal oxide semiconductor material.

15. The transistor of claim 1, wherein the source and drain regions are formed by a thermal annealing process.

16. A transistor, comprising:
a word line disposed on a substrate;
a semiconductor layer disposed on the substrate, the semiconductor layer comprising a source region, a drain region, and a channel region disposed between the source and drain regions and overlapping with the word line in a vertical direction perpendicular to a plane of the substrate;
a hydrogen diffusion barrier film overlapping with the channel region in the vertical direction;
a gate dielectric layer disposed between the channel region and the word line;
a source electrode and a drain electrode electrically coupled to respective source regions and drain regions;
a first dielectric layer disposed between the semiconductor layer and the substrate;
a second dielectric layer disposed on the first dielectric layer, covering the semiconductor layer and the hydrogen diffusion barrier film, wherein,
the source region and the drain region directly contact the second dielectric layer; and
the channel region directly contacts the hydrogen diffusion barrier film.

17. The transistor of claim 15, wherein:
the source region and the drain region have higher hydrogen content than the channel region; and
the hydrogen diffusion barrier film comprises a dielectric material; and
the semiconductor layer comprises a metal oxide semiconductor material.

18. A transistor, comprising:
a gate electrode;
a semiconductor layer disposed on the gate electrode, the semiconductor layer comprising a source region, a drain region, and a channel region disposed between the source region and drain region and overlapping with the gate electrode in a vertical direction;
a hydrogen diffusion barrier film overlapping with the channel region in the vertical direction; and
a gate dielectric layer disposed between the channel region and the gate electrode,
wherein the source and drain regions have a higher hydrogen concentration than the channel region.

19. The transistor of claim 18, further comprising a source electrode and a drain electrode electrically coupled to the respective source region and drain region.

20. The transistor of claim 18, wherein the hydrogen diffusion barrier film comprises a dielectric material and has a thickness that ranges from about 1 nm to about 200 nm.

* * * * *